(12) United States Patent
Ichinose et al.

(10) Patent No.: US 8,168,729 B2
(45) Date of Patent: May 1, 2012

(54) THERMOSETTING RESIN COMPOSITION

(75) Inventors: Eiju Ichinose, Chiba (JP); Hideyuki Ishida, Chiba (JP); Kouichi Murakami, Berlin (DE)

(73) Assignee: DIC Corporation, Tokyo (JP)

( * ) Notice: Subject to any disclaimer, the term of this patent is extended or adjusted under 35 U.S.C. 154(b) by 111 days.

(21) Appl. No.: 12/097,011

(22) PCT Filed: Dec. 15, 2006

(86) PCT No.: PCT/JP2006/325073
§ 371 (c)(1),
(2), (4) Date: Jun. 11, 2008

(87) PCT Pub. No.: WO2007/069732
PCT Pub. Date: Jun. 21, 2007

(65) Prior Publication Data
US 2009/0192273 A1 Jul. 30, 2009

(30) Foreign Application Priority Data

Dec. 15, 2005 (JP) .................................. 2005-361691
Jan. 18, 2006 (JP) .................................. 2006-009823
Mar. 15, 2006 (JP) .................................. 2006-070715

(51) Int. Cl.
C08G 73/14 (2006.01)

(52) U.S. Cl. .......... 525/454; 525/418; 525/460; 528/60; 528/353; 528/363

(58) Field of Classification Search .................. 525/454, 525/460
See application file for complete search history.

(56) References Cited

U.S. PATENT DOCUMENTS

| 3,242,107 | A | * | 3/1966 | Hertlein et al. | 521/177 |
| 3,491,060 | A | * | 1/1970 | Wilhelm et al. | 528/126 |
| 3,869,428 | A | * | 3/1975 | Mosimann et al. | 528/45 |
| 3,948,824 | A | * | 4/1976 | Robins | 521/171 |
| 4,293,658 | A | * | 10/1981 | Raden et al. | 521/129 |
| 4,316,974 | A | * | 2/1982 | Ohmura et al. | 525/422 |
| 4,737,567 | A | * | 4/1988 | Matsumoto et al. | 528/167 |
| 5,254,659 | A | * | 10/1993 | Tajima et al. | 528/45 |
| 5,310,850 | A | * | 5/1994 | Chen et al. | 528/73 |
| 5,514,747 | A | * | 5/1996 | Hsu et al. | 524/590 |
| 6,784,275 | B2 | * | 8/2004 | Ichinose et al. | 528/170 |
| 6,887,967 | B2 | * | 5/2005 | Ichinose et al. | 528/170 |
| 2003/0149222 | A1 | | 8/2003 | Ichinose et al. | |

FOREIGN PATENT DOCUMENTS

| JP | 5-295090 A | 11/1993 |
| JP | 8-301967 A | 11/1996 |
| JP | 2001-316469 A | 11/2001 |
| JP | 2003-238807 A | 8/2003 |
| JP | 2003-292575 A | 10/2003 |
| JP | 2005264054 A * | 9/2005 |
| JP | 2006-117922 A | 5/2006 |
| WO | 2006/033439 A1 | 3/2006 |

OTHER PUBLICATIONS

Machine Translation of JP 08-301967 A.*
Machine Translation of JP 2005264054 A.*

* cited by examiner

*Primary Examiner* — Randy Gulakowski
*Assistant Examiner* — Mike M Dollinger
(74) *Attorney, Agent, or Firm* — Edwards Wildman Palmer LLP; James E. Armstrong, IV; Junko Harada

(57) ABSTRACT

The object of the present invention is to provide a thermosetting resin composition which can provide a cured material which is excellent in heat resistance, electrical properties, and flexibility, and has storage stability before curing, and in order to achieve the object, the present invention provide a thermosetting resin composition containing a polyurethane resin (A) which has the structure represented by the following general formula (1) and/or the general formula (2), and an epoxy resin (B).

[Chemical formula 58]

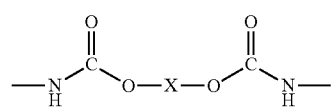

(1)

[Chemical formula 59]

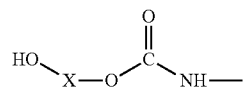

(2)

(In the chemical formulae, X represents a residue in which two phenolic hydroxyl groups are excluded from a phenol compound having two or more phenolic hydroxyl groups in the molecule.)

14 Claims, No Drawings

THERMOSETTING RESIN COMPOSITION

CROSS-REFERENCE TO PRIOR APPLICATION

This is a U.S. National Phase Application under 35 U.S.C. §371 of International Patent Application No. PCT/JP2006/325073 filed Dec. 15, 2006, and claims the benefit of Japanese Patent Application Nos. 2005-361691 filed Dec. 15, 2005, 2006-009823 filed Jan. 18, 2006 and 2006-070715 filed Mar. 15, 2006, all of which are incorporated by reference herein. The International Application was published in Japanese on Jun. 21, 2007 as WO 2007/069732 A1 under PCT Article 21(2).

TECHNICAL FIELD

The present invention relates to a thermosetting resin composition which can provide a cured material which has excellent heat resistance, electrical properties, and flexibility, and has excellent storage stability before curing, and is preferably used in the field of many kinds of heat-resistant coating materials and electric insulating materials, such as interlayer insulating materials for printed circuit boards, building materials, insulating materials for semiconductors, heat-resistant adhesives, etc.

BACKGROUND OF THE INVENTION

Cured materials made of a resin composition used in the electrical and electronic industries, such as heat-resistant coating materials and electric insulating materials, for example, interlayer insulation materials for a printed circuit board, building materials, insulating materials for semiconductors, and heat-resistant adhesives are required to have improved heat resistance, and electrical properties, such as a lower dielectric constant and a lower dielectric tangent, and flexibility. In addition, improvements in the storage stability of such resin compositions before curing are desired. In particular, problems have been found to occur in terms of transfer characteristics, such as transfer delays in signals from printed circuit boards and generation of cross-talk due to recent improvements in signal speed and the high frequency of electronic equipment, such as computers. In addition, the resin composition used in a print board is required to provide a cured material having a lower dielectric constant.

Examples of a resin composition which can provide a cured material having excellent heat resistance include a resin composition containing an epoxy resin. Examples of the resin composition include an epoxy resin composition containing an epoxy resin having a weight average molecular weight of less than 35,000, a polyfunctional phenol resin, and an epoxy resin having a weight average molecular weight of 35,000 or more, a curing accelerator, a reducing agent, and a urea compound (for example, see Patent document No. 1). However, this epoxy resin composition could not provide a curing product having satisfactory heat resistance, electrical properties, and dimensional stability.

Examples of another resin composition include resin compositions containing a polyimide resin. Examples of the resin composition containing a polyimide resin include a thermosetting polyimide resin composition containing a polyimide resin which has a carboxyl group and a linear hydrocarbon structure having a number average molecular weight of 300 to 6,000, and an epoxy resin (for example, see Patent document No. 2). However, the thermosetting polyimide resin composition could not provide a cured material which had sufficient heat resistance and dimensional stability.

[Patent document No. 1] Japanese Unexamined Patent Application, First Publication No. H5-295090

[Patent document No. 2] Japanese Unexamined Patent Application, First Publication No. 2003-292575

DISCLOSURE OF THE INVENTION

Problems to be Solved

The problem to be solved by the present invention is to provide a thermosetting resin composition that provides a cured material which has excellent heat resistance, electrical properties, and flexibility, and can be stably stored before curing.

Means for Solving the Problem

As a result of conducting diligent research, the inventors of the present invention found the following.

(1) A cured material of a resin composition containing a polyurethane resin which has a residual structure of a phenol compound and a urethane bond generated by a reaction between a phenolic hydroxyl group and an isocyanate group, and an epoxy resin has excellent heat resistance, electrical properties, and flexibility.

(2) A cured material of a resin composition containing a polyimide resin which has a residual structure of a phenol compound and a urethane bond generated by a reaction between a phenolic hydroxyl group and an isocyanate group, and an epoxy resin has further excellent heat resistance than that of a cured material produced by a resin composition containing a polyurethane resin.

(3) The resin composition also has excellent storage stability.

The present invention is achieved based on these findings.

That is, the present invention provides a thermosetting resin composition containing a polyurethane resin (A) which has a structure represented by the following general formula (1) and/or the general formula (2), and an epoxy resin (B).

[Chemical formula 1]

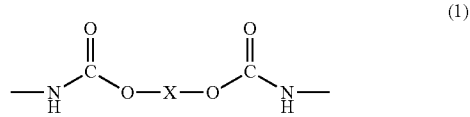
(1)

[Chemical formula 2]

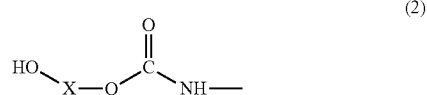
(2)

(In the chemical formulae, X represents a residue in which two phenolic hydroxyl groups are excluded from a phenol compound having two or more phenolic hydroxyl groups in the molecule.)

In addition, the present invention provides a thermosetting resin composition containing a polyimide resin (C) which has the structure represented by the following general formula (1) and/or general formula (2), and an epoxy resin (B).

[Chemical formula 3]

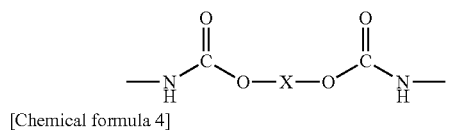

[Chemical formula 4]

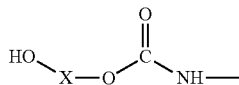

(In the chemical formulae, X represents a residue in which two phenolic hydroxyl groups are excluded from a phenol compound having two or more phenolic hydroxyl groups in the molecule.)

Effects of the Present Invention

The thermosetting resin compositions containing the polyurethane resin and the thermosetting resin compositions containing the polyimide resin of the present invention can provide a cured material which has excellent heat resistance, electrical properties, and flexibility. In addition, the thermosetting resin compositions also have excellent storage stability. Therefore, the thermosetting resin compositions of the present invention can be preferably used as heat-resistant coating materials or electrical insulation materials.

BEST MODE FOR CARRYING OUT THE INVENTION

The polyurethane resin (A) used in the present invention has a structure in which an isocyanate group and a phenolic hydroxyl group are connected as a polyurethane bond, as shown in the following general formula (1) and/or the following general formula (2). It is preferable that the polyurethane resin (A) be a polyurethane resin which is dissolved in an organic solvent, because the polyurethane resin can be easily handled.

[Chemical formula 5]

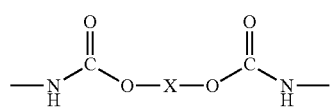

[Chemical formula 6]

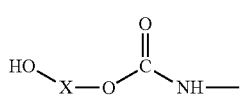

(In the chemical formulae, X represents a residue in which two phenolic hydroxyl groups are excluded from a phenol compound having two or more phenolic hydroxyl groups in the molecule.)

Examples of the polyurethane resin having the structure represented by the general formula (1) include the polyurethane resin having the structure represented by the following general formula (3).

[Chemical formula 7]

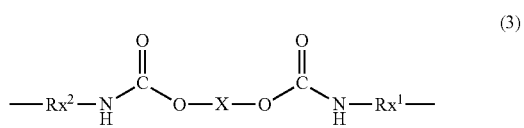

(In the chemical formula, $Rx^1$ and $Rx^2$ may be identical or not, and represent a residue in which two isocyanurate groups are excluded from a polyisocyanate compound. X represents a residue in which two phenolic hydroxyl groups are excluded from a phenol compound having two or more phenolic hydroxyl groups in the molecule.)

In addition, examples of the polyurethane resin having the structure represented by the general formula (2) include a polyurethane resin having the structure represented by a following general formula (4).

[Chemical formula 8]

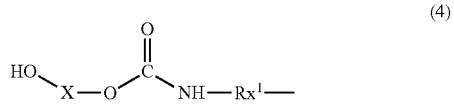

(In the general formula, $Rx^1$ represents a residue in which two isocyanate groups are excluded from a polyisocyanate compound. X represents a residue in which two phenolic hydroxyl groups are excluded from a phenol compound having two or more phenolic hydroxyl groups in the molecule.)

$Rx^1$ and $Rx^2$ in the general formulae (3) and (4) may be identical or not.

When $Rx^1$ and/or $Rx^2$ in the general formula (3) correspond to $R^5$ in the following general formula (15), a branched polyurethane resin having the structure in which the structure represented by the general formula (1) bonded to the structure represented by the general formula (15) is obtained. When $Rx^1$ in the general formula (4) corresponds to $R^5$ in the following general formula (15), a branched polyurethane resin having the structure in which the structure represented by the general formula (2) bonded to the structure represented by the general formula (15) is obtained.

Examples of X in the general formulae (1) to (4) include the following structures.

[Chemical formula 9]

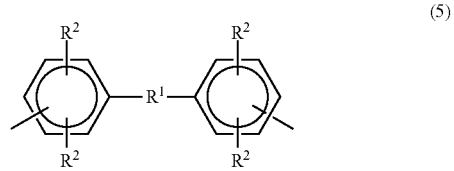

(In the general formula, $R^1$ represents a single bond or a divalent connecting group. $R^2$ may be identical or not, and represents a hydrogen atom or an alkyl group having 1 to 18 carbon atoms.)

[Chemical formula 10]

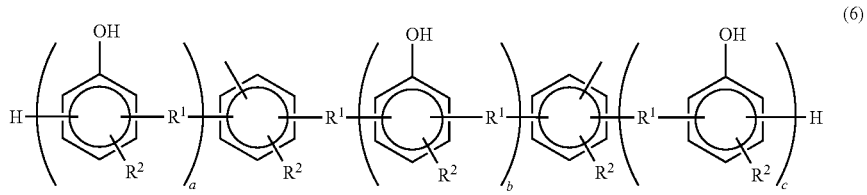

(6)

(In the general formula, R¹ represents a single bond or a divalent connecting group. R² may be identical or not, and represents a hydrogen atom or an alkyl group having 1 to 18 carbon atoms. The total of a, b and c is one or more.)

[Chemical formula 11]

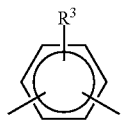

(7)

(In the general formula, R³ represents a hydrogen atom, an alkyl group having 1 to 18 carbon atoms, or the structure represented by the following general formula (8).)

[Chemical formula 12]

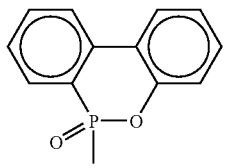

(8)

[Chemical formula 13]

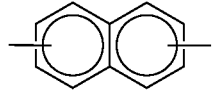

(9)

[Chemical formula 14]

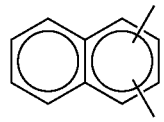

(10)

Examples of a preferable polyurethane resin (A) used in the present invention include polyurethane resins in which X in the general formulae (1) and (2) has one or more structures selected from the group consisting of the general formulae (5) to (7), and (9). These polyurethane resins can provide a cured material having excellent heat resistance. Among these polyurethane resins, polyurethane resins having structures represented by the general formula (5) or (6) are more preferable. When the polyurethane resin used in the present invention has the structure represented by the general formula (13) which can provide flexibility to the cured material, which is explained below, it is preferable that X in the formulae (1) and (2) have the structure represented by the general formula (6).

Examples of R¹ in the structure represented by the general formulae (5) and (6) include a direct bonding; and divalent connecting groups such as a carbonyl group, a sulfonyl group, a methylene group, an isopropylidene group, a hexafluoro isopropylidene group, an oxo group, a dimethylsilylene group, a fluorene-9-diyl group, and a tricyclo[5.2.1.0$^{2,8}$]decane-diyl group. Examples of R² in the structure represented by the general formulae (5) and (6) include a hydrogen atom and alkyl groups having 1 to 18 carbon atoms, such as a methyl group, an ethyl group, a propyl group, a butyl group, a pentyl group, a hexyl group, an octyl group, a nonyl group, a decyl group, an undecyl group, dodecyl, a hexadecyl group, and a stearyl group. Examples of an alkyl group having 1 to 18 carbon atoms as R³ in the structure represented by the general formula (7) include: a methyl group, an ethyl group, a propyl group, a butyl group, a pentyl group, a hexyl group, an octyl group, a nonyl group, a decyl group, an undecyl group, dodecyl, a hexadecyl group, and a stearyl group.

In the present invention, the carbonyl group is represented by the following general formula (1a), the sulfonyl group is represented by the following general formula (1b), the methylene group is represented by the following general formula (1c), the isopropylidene group is represented by the following general formula (1d), the hexafluoro isopropylidene group is represented by the following general formula (1e), the oxo group is represented by the following general formula (1f), the dimethylsilylene group is represented by the following general formula (1 g), the fluorene-9-diyl group is represented by the following general formula (1h), and the tricyclo[5.2.1.0$^{2,8}$]decane-diyl group is represented by the following general formula (1i). These are residues of biphenol, tetramethyl biphenol, bisphenol A, bisphenol F, bisphenol S, naphthalenediol, a dicyclopentadiene-modified bisphenol, and the like. ("*" in the general formulae represents a binding site.) In addition, these may be structural residues in which two hydroxyl groups are excluded from polyphenol resins, such as a phenol novolack resin, a cresol novolack resin, and a polyphenol resin which is synthesized by naphthol, alkylphenol, and a formaldehyde condensate.

[Chemical formula 15]

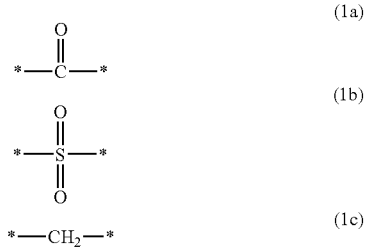

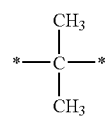
(1d)

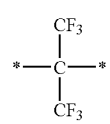
(1e)

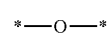
(1f)

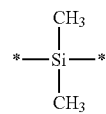
(1g)

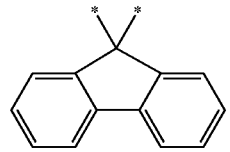
(1h)

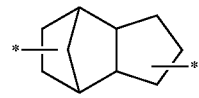
(1i)

Among the structures of $R^1$ in the general formula (5), the structures represented by the general formulae (1b), (1c), and (1d) are preferable, because they can provide a thermosetting polyurethane resin composition having excellent compatibility and are easily synthesized. A hydrogen atom and a methyl group are preferable as $R^2$. In addition, the structure represented by the general formula (1i) is preferably $R^1$ in the general formula (6), because this structure can provide a thermosetting polyurethane resin composition having excellent heat resistance. Moreover, the structure represented by the general formula (1i) is represented by the following general formula (11) hereafter.

[Chemical formual 18]

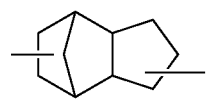
(11)

[Chemical formula 16]

The polyurethane resin (A) used in the present invention has only to have structure represented by the general formula (1) and/or the general formula (2). In particular, when a poly-urethane resin having the structure represented by the general formulae (1) and (2) is used, a thermosetting resin composition having excellent curing properties is obtained. Therefore, the polyurethane resin having the structure represented by the general formulae (1) and (2) is preferable. Moreover, X in the structure represented by the general formulae (1) and (2) may be identical or not.

Examples of the polyurethane resin having the structure represented by the general formula (6) include a polyurethane resin having the following structure.

[Chemical formula 17]

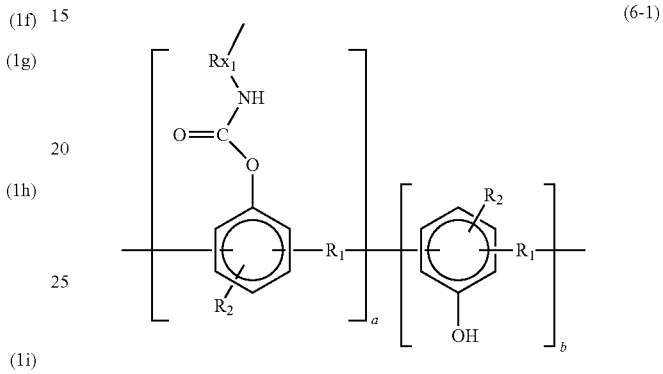
(6-1)

$Rx_1$ may be identical or not, and represents a residue in which two isocyanate groups are excluded from a polyisocyanate compound. a and b are integers of 1 to 10 respectively, and the units in parentheses can be connected at random.

When a is 1 (case 1), the obtained polyurethane resin has the polyphenol structure at the end of the structure represented by the general formula (2). When a is 2 (case 2), the obtained polyurethane resin has the polyphenol structure in the main chain. When a is 3 or more (case 3), the obtained polyurethane resin is branched. It is also possible for cases 1, 2, and 3 to coexist in a molecule.

Examples of the polyurethane resin having the structure represented by the general formulae (1) and (2) include a polyurethane resin having the structure represented by the general formula (12).

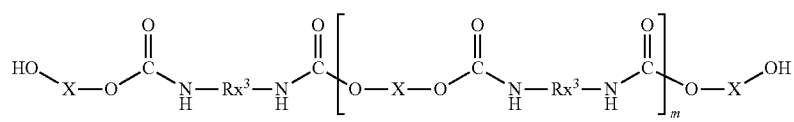
(12)

(In the general formula, $Rx^3$ represents a residue in which two isocyanate groups are excluded from a polyisocyanate compound. X represents a residue in which two phenolic hydroxyl groups are excluded from a phenol compound having two or more phenolic hydroxyl groups in the molecule. m is an integer from 0 to 100.)

When the polyurethane resin (A) is a polyurethane resin having the structure represented by the general formulae (3) and (4), and $Rx^1$ and $Rx^2$ are residues in which two isocyanate groups are excluded from a polyisocyanate compound, the polyurethane resin (A) has the linear structure represented by the general formula (12). When $Rx^1$ and $Rx^2$ are residues in which two isocyanate groups are excluded from a polyisocyanate compound having three or more isocyanate groups, the polyurethane resin (A) has a branched structure.

A hydroxyl group at the end of the structure represented by the general formula (2) is a phenolic hydroxyl group. The phenolic hydroxyl group is a remaining phenolic hydroxyl group, except for one hydroxyl group of a polyfunctional phenolic compound that is connected to a resin skeleton as a urethane bond. A bifunctional phenolic compound is preferable as a polyfunctional compound having phenolic hydroxyl groups used to produce the structure represented by the general formula (2). However, a polyphenol compound having three or more functional groups may be used rather than a bifunctional phenolic compound. A polyphenol compound having three or more functional groups may also be used together with a bifunctional phenolic compound. Thereby, plural phenolic hydroxyl groups may remain at the end of the structure.

The urethane resin (A) used in the present invention has a urethane bond formed of a phenolic hydroxyl group and an isocyanate group, as represented by the general formula (1) and/or (2). In general, the urethane bond formed of a phenolic hydroxyl group and an isocyanate group is dissociated under high temperatures. Therefore, a low-molecular-weight mono phenolic compound, such as phenol, and cresol, may be used as a blocking agent for an isocyanate group. However, the blocking agent does dissociate and forms a volatile component in the curing reaction for a coated film or for a molded article. The volatile component generates air bubbles or voids. Therefore, use of the blocking agent is not preferable.

In the present invention, a phenolic hydroxyl group is introduced using a polyphenolic compound having two or more functional groups. Therefore, even if the urethane bond is dissociated from the resin under high temperatures, it is not vaporized, and remains in the system. Due to this, the polyurethane resin (A) is positively cross-linked with an epoxy resin, and is further cured. The isocyanate group further undergoes a urethanization reaction with an alcoholic hydroxyl group generated by the reaction of the phenolic hydroxyl group and an epoxy group to produce another cross-linking structure. Thereby, adverse hydroxyl groups having dielectric properties are blocked. In other words, the inventors of the present invention believe that the produced urethane bond forms a further new network with the resin skeleton, and thereby excellent heat resistance and mechanical properties can be realized.

When the polyurethane resin (A) used in the present invention is a polyurethane resin having the structure represented by the general formula (2), the polyurethane resin has a phenolic hydroxyl group at the end. The hydroxyl group is also reacted with an epoxy resin to contribute to curing.

When the polyurethane resin having the following general formula (13) is used as the polyurethane resin (A) in the thermosetting resin composition of the present invention, a cured material having a larger elongation rate and better flexibility is produced. Therefore, the thermosetting resin composition containing the polyurethane resin having the structure represented by the following general formula (13) is preferably used as a resin composition for an insulating layer used in a flexible substrate.

[Chemical formula 19]

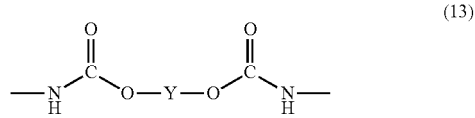

(13)

(In the general formula, Y represents a residue in which two hydroxyl groups are excluded from a polyol compound having at least two alcoholic hydroxyl groups in the molecule.)

Examples of the residue (residual structure) represented by Y, in which two hydroxyl groups are excluded from a polyol compound having at least two alcoholic hydroxyl groups in the molecule, include a residue in which two alcoholic hydroxyl groups are excluded from a polyolefin polyol having at least two alcoholic hydroxyl groups in the molecule, a residue in which two hydroxyl groups are excluded from a polyether polyol having at least two alcoholic hydroxyl groups in the molecule, a residue in which two hydroxyl groups are excluded from a polycarbonate polyol having at least two alcoholic hydroxyl groups in the molecule, a residue in which two hydroxyl groups are excluded from a polyester polyol having at least two alcoholic hydroxyl groups in the molecule, and a residue in which two alcoholic hydroxyl groups are excluded from a polysiloxane polyol having at least two alcoholic hydroxyl groups in the molecule. In addition, Y may have a residual structure and/or a copolycondensation of at least one of these residual structures.

In particular, when the dielectric properties of a coated film need to be improved, in addition to the flexibility, it is preferable that Y in the general formula (13) be a residue in which two hydroxyl groups are excluded from a polyolefin polyol having at least two alcoholic hydroxyl groups in the molecule. When the physical properties and hydrolysis resistance are required to be improved, it is preferable that Y be a residue in which two hydroxyl groups are excluded from a polycarbonate polyol having at least two alcoholic hydroxyl groups in the molecule.

The number average molecular weight of Y in the general formula (13) is preferably in a range from 300 to 5,000, and more preferably in a range from 500 to 3,000, because the elongation rate of the cured material is large and excellent flexibility can be obtained. In addition, the glass transition temperature (Tg) of Y is preferably 0° C. or less, and more preferably in a range from 0 to −150° C.

Examples of the polyurethane resin having the structure represented by the general formulae (1) and/or (2), and (13) include a polyurethane resin having the structure represented by the following general formula (14).

[Chemical formula 20]

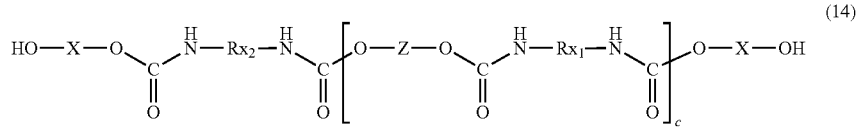

(14)

(In the general formula, $RX_1$ and $RX_2$ may be identical or not, and represent a residual structure in which two isocyanate groups are excluded from a polyisocyanate compound. Z represents the residue (X) in which two hydroxyl groups are excluded from a polyol compound having at least two alcoholic hydroxyl groups or the residue (Y) in which two hydroxyl groups are excluded from a polyol compound having at least two alcoholic hydroxyl groups. However, Z in at least one structure in parentheses, which is repeated by the repeated time "c", is Y. c is an integer from 1 to 100.)

The polyurethane resin having the structure represented by the general formula (13) has the structure represented by the general formula (1) and/or (2), and the structure represented by the general formula (13). Among these polyurethane resins, a polyurethane resin having the structures represented by all the general formulae (1), (2), and (13) is preferable, because the polyurethane resin can provide a cured material having excellent heat resistance and hardenability. X in the structure represented by the general formula (1) and (2) may be identical or not.

It is preferable that the polyurethane resin (A) used in the present invention be a branched polyurethane resin having the structure represented by the following general formula (15), because the polyurethane resin has improved compatibility with other resins, solubility to a solvent, and can improve heat resistance of a cured coated film.

[Chemical formula 21]

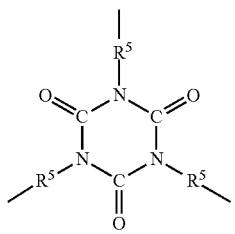

(15)

(In the general formula, $R^5$ represents a residual structure in which an isocyanate group is excluded from a diisocyanate compound.)

Examples of $R^5$ in the general formula (15) include a residual structure, such as a residual structure of an aromatic compound, a residual structure of an aliphatic compound, and a residual structure of an alicyclic compound. Especially, a residual structure having 4 to 13 carbon atoms is preferably used. It is also preferable that $R^5$ have two or more structures to prevent crystallization and improve solubility. In particular, it is more preferable that $R^5$ have both the residual structure of an aromatic compound, and the residual structure of an aliphatic compound or an alicyclic compound.

The branched polyurethane resin having the structure represented by the general formula (15) can be synthesized using an isocyanurate type polyisocyanate compound as a raw material, for example.

The polyurethane resin (A) used in the present invention can be easily obtained by reacting a polyphenol compound (a1) having two or more phenolic hydroxyl groups and a polyisocyanate compound (a2). Specifically, the polyphenol compound (a1) and the polyisocyanate compound (a2) are put into a flask equipped with an agitating device, a thermometer, and a condenser, and then the temperature is raised to initiate a reaction while stirring and paying attention to heat generation. The temperature can be raised to a range from 50 to 250° C., and preferably a range from 70 to 180° C. when the reaction speed and the prevention of a side reaction are taken into consideration. In order to prevent the dissociation of urethane bonds, the temperature in a range from 70 to 140° C. is most preferable. The reaction time is usually in the range from 1 to 20 hours.

Examples of the polyphenol compound (a1) having two or more phenolic hydroxyl groups include hydroquinone, biphenol, tetramethyl biphenol, ethylidene bisphenol, bisphenol A, bisphenol F, bisphenol S, cyclohexylidene bisphenol (bisphenol Z), dimethylbutylidene bisphenol, 4,4'-(1-methylethylidene)bis[2,6-dimethylphenol], 4,4'-(1-phenylethylidene)bisphenol, 5,5'-(1-methylethylidene)bis[1,1'-biphenyl-2-ol], naphthalenediol, dicyclopentadiene-modified bisphenol, and a reaction product of 9,10-dihydro-9-oxa-10-phosphorphenanthrene-10-oxide and hydroquinone.

Phenolic compounds having three or more functional groups, for example, alkyl phenol novolac resin, such as phenol novolac resin, cresol novolac resin, and nonyl phenol novolac resin can also be used as the polyphenol compound (a1).

It is more preferable that the polyphenol compound (a1) be a polyphenol compound having two phenolic hydroxyl groups, i.e., a bifunctional polyphenol compound. In particular, it is most preferable that the polyphenol compound (a1) be a bisphenol compound, such as bisphenol A, bisphenol F, and bisphenol S.

It is preferable that when the polyurethane resin is produced, a reaction product between naphthalenediol or 9,10-dihydro-9-oxa-10-phosphorphenanthrene-10-oxide, and hydroquinone is used. Thereby, a cured material which has excellent flame resistance and heat resistance is obtained.

Moreover, a monofunctional phenolic compound, such as phenol and cresol, may be used at the same time without impairing the effects of the present invention.

Examples of the polyisocyanate compound (a2) used in the present invention include an aromatic polyisocyanate compound, and an aliphatic polyisocyanate compound.

Examples of the aromatic polyisocyanate compound include aromatic diisocyanate compounds, such as p-phenylene diisocyanate, m-phenylene diisocyanate, p-xylene diisocyanate, m-xylene diisocyanate, 2,4-tolylene diisocyanate, 2,6-tolylene diisocyanate, 4,4'-diphenylmethane diisocyanate, 3,3'-dimethyldiphenyl-4,4'-diisocyanate, 3,3'-diethyldiphenyl-4,4'-diisocyanate, m-xylene diisocyanate, p-xylene diisocyanate, 1,3-bis(α,α-dimethyl isocyanate methyl)benzene, tetramethylxylylene diisocyanate, diphenylene ether-4, 4'-diisocyanate, and naphthalene diisocyanate.

Examples of the aliphatic polyisocyanate compound include hexamethylene diisocyanate, lysine diisocyanate, trimethylhexamethylene methylene diisocyanate, isophorone diisocyanate, 4,4'-dicyclohexylmethane diisocyanate, hydrogenated xylene diisocyanate, and norbornene diisocyanate.

It is also possible to use an isocyanate prepolymer which is obtained by reacting the polyisocyanate compound (a2) and various kinds of a polyol compound in the presence of excess isocyanate groups in advance as the polyisocyanate compound (a2). In addition, it is also possible to use the isocyanate prepolymer together with the polyisocyanate compound (a2).

It is preferable that the polyurethane resin (A) used in the thermosetting polyurethane resin composition of the present invention have a branched structure, because the solubility to a solvent and the compatibility with a curing agent and other resin components are improved. In order to obtain the branched polyisocyanate, it is preferable to use only a polyisocyanate compound having three or more functional groups and an isocyanurate ring, which is an isocyanurate of a diisocyanate compound, etc. or a mixture containing such a polyisocyanate compound and the isocyanate compound.

For example, the polyisocyanate compound having three or more functional groups and an isocyanurate ring is obtained by isocyanurating one or more kinds of diisocyanate compound in the presence of or without an isocyanuration catalyst, such as a quarternary ammonium salt. Examples of the polyisocyanate compound include a mixture containing a trimer, a pentamer, a heptamer, and the like of an isocyanurate. Examples of the isocyanurate of the polyisocyanate compound include aliphatic polyisocyanates, such as isocyanurate type polyisocyanate of isophorone diisocyanate, isocyanurate type polyisocyanate of hexamethylene diisocyanate, isocyanurate type polyisocyanate of hydrogenated xylene diisocyanate, and isocyanurate type polyisocyanate of norbornane diisocyanate, isocyanurate type polyisocyanate of diphenylmethane diisocyanate, isocyanurate type polyisocyanate of tolylene diisocyanate, isocyanurate type polyisocyanate of xylene diisocyanate, and isocyanurate type polyisocyanate of naphthalene diisocyanate.

When using both a diisocyanate compound and a diisocyanate compound having three or more functional groups and an isocyanurate ring as the polyisocyanate compound (a2), a mixture is preferably used which contains an aromatic diisocyanate as the diisocyanate compound, isocyanurate type polyisocyanate of an aliphatic diisocyanate and/or isocyanurate type polyisocyanate of a cycloaliphatic diisocyanate as the diisocyanate compound having an isocyanurate ring and three or more functional groups.

When an aliphatic diisocyanate compound is used as the polyisocyanate compound (a2), the thermosetting polyurethane resin composition having excellent solubility, and a cured coated film having excellent electric properties is also used. Therefore, it is preferable to use an aliphatic diisocyanate compound as the polyisocyanate compound (a2).

In addition, it is possible to use a compound other than the polyisocyanate compound, such as the diisocyanate compound, a buret, adduct, or alphanate of the diisocyanate compound, or polymethylene polyphenyl polyisocyanate (crewed MDI), and the like together with the polyisocyanate compound (a2).

It is preferable to use two or more kinds of polyisocyanate compounds as the polyisocyanate compound (a2). Thereby, the thermosetting polyurethane resin composition having excellent solubility to a solvent can be obtained. In addition, it is also preferable to use the isocyanurate at the same time. Thereby, the cured coated film having excellent heat resistance can be obtained. When the isocyanurate is used at the same time, the content of the isocyanurate is preferably 70% by weight relative to the total amount of the polyisocyanate compound (a2). Thereby, an increase of the molecular weight or gelatification of the obtained polyurethane resin (A) can be prevented.

When the polyphenol compound (a1) and the polyisocyanate compound (a2) are reacted, the polyphenol compound (a1) reacts with the polyisocyanate compound (a2). In order to retain a phenolic hydroxyl group at the end of the polyurethane resin (A), it is preferable that they are reacted under conditions in which the number of moles of the phenolic hydroxyl group in the polyphenol compound (a1) is larger than the number of moles of the isocyanate group in the polyisocyanate compound (a2). When the stability of synthesis and various characteristics of a cured material are taken into consideration, the ratio [the number of moles of the phenolic hydroxyl group in the (a1)/the number of moles of the isocyanate group in the (a2)] of the number of moles of the phenolic hydroxyl group and the number of moles of the isocyanate group is preferably in a range from 1 to 10, and more preferably in a range from 1.05 to 7.

It is preferable that the reaction be conducted completely until almost all of the isocyanate reacts, because the obtained polyurethane resin (A) has excellent stability. In addition, it is also possible to add alcohol or a phenol compound in small amount of remaining isocyanate to react them.

The polyurethane resin further having the structure represented by the general formula (13) is, for example, obtained easily by a method in which the polyphenol compound (a1) having two or more phenolic hydroxyl groups, the polyisocyanate compound (a2), and a polyol compound (a3) are reacted.

Examples of the polyol compound (a3) include polyolefin polyol, polyether polyol, polycarbonate polyol, polyester polyol, and polysiloxane polyol. These polyol compounds may be used alone or in combination of two or more. In addition, examples of the polyol compound (a3) also include polyols which have two or more copolycondensation structures of polyolefin polyol, polyether polyol, polycarbonate polyol, polyester polyol, and polysiloxane polyol.

Examples of the polyolefin polyol include polyol compounds having a polyolefin structure or a polydiene structure. Specifically, examples of the polyolefin polyol include polyethylene polyol, polypropylene polyol, polybutadiene polyol, hydrogenated polybutadiene polyol, polyisoprene polyol, hydrogenated polyisoprene polyol. Among these, polybutadiene polyol and/or hydrogenated polybutadiene polyol are preferable, hydrogenated polybutadiene polyol is more preferable, and polyolefindiol is most preferable.

A number average molecular weight of an aliphatic structure part of the polyolefin polyol is preferably in a range from 300 to 6,000.

Examples of the polyether polyol include alkylene ether polyols, such as polyethylene glycol, polypropylene glycol, polytetramethylene glycol, and polybutylene glycol, and a copolymer of these polyalkylene polyols. These may be used alone or in combination of two or more thereof.

Examples of the polycarbonate polyol include polyalkylene carbonate polyols obtained from propylenediol, butanediol, pentanediol, hexanediol, methyl pentanediol, and cyclohexane dimethanol, and polycarbonate polyols obtained from alkylene oxide addition diol, such as bisphenol A, bisphenol F, and bisphenol S, and copolymers thereof.

Examples of the polyester polyol include an ester compound between alkylene ester and polycarboxylic acid, an ester exchange reaction product of alkylester of polycarboxylic acid and alkylene diol, and polylactone polyol such as ∈-caprolacton polylactone polyol.

Examples of the polysiloxane polyol include dimethylpolysiloxane polyol, and methylphenyl polysiloxane polyol.

In particular, when dielectric properties are improved, it is preferable that the polyol compound (a3) be polyolefin polyol or polysiloxane polyol. When physical properties and hydrolysis resistance need to be improved, it is preferable that the polyol compound (a3) be polycarbonate polyol.

Since the synthesis is easily carried out, the polyol compound (a3) preferably has 1.4 to 4 hydroxyl groups, and more preferably 2 hydroxyl groups. That is, a diol compound is more preferable.

Among diols, the diol compound is preferably at least one selected from the group consisting of polyolefindiol, polyetherdiol, polycarbonatediol, polyesterdiol, and polysiloxanediol.

Since a coated film having a sufficient elongation rate, and high strong intensity is obtained, the polyol compound (a3) preferably has the number average molecular weight of 300 to 5,000, and more preferably 500 to 3,000.

In addition, the Tg of the polyol compound (a3) is preferably to 0° C. or less, and more preferably in a range from 0 to −150° C., because the elongation rate and flexibility can be improved.

When preparing the polyurethane resin further having the structure represented by the general formula (13) as the polyurethane resin (A) used in the present invention, the polyphenol compound (a1) and the polyol compound (a3) react respectively with the polyisocyanate compound (a2). In order to retain a phenolic hydroxyl group at the end, it is preferable that they are reacted under conditions in which the total number of moles (m(a1) mol) of the phenolic hydroxyl group in the polyphenol compound (a1) and the number of moles (m(a3) mol) of the alcoholic hydroxyl group in the polyol compound (a3) be larger than the number of moles (m(a2) mol) of the isocyanate group in the polyisocyanate compound (a2). When stability in synthesis and various characteristics of a cured material are taken into consideration, a ratio of {m(a1)+m(a3)}/m(a2) is preferably in a range from 1 to 10, and more preferably in a range from 1 to 7. In addition, each of m (a1) and m (a3) is preferably 5% by weight or more relative to the total weight of m (a1) and m (a3), and more preferably 10% by weight or more.

It is preferable to use an organic solvent in a production method of the polyurethane resin (A) used in the present invention. Thereby, a uniform reaction can be performed. The organic solvent may be added to the reaction system in advance, or in the middle of the reaction. In order to maintain adequate reaction speed, the ratio of the organic solvent in the reaction system is preferably 80% by weight or less relative to the weight of the reaction system, and more preferably in a range from 10 to 70% by weight. It is preferable that the organic solvent be an aprotic polar organic solvent which does not have active protons, such as a hydroxyl group or an amino group, because the reaction uses a compound containing an isocyanate group as a raw material.

Examples of the aprotic polar organic solvent include polar organic solvents, such as dimethyl formamide, dimethyl acetamide, N-methyl-2-pyrrolidone, dimethyl sulfoxide, sulfolane, and γ-butyrolactone. As long as it is dissolvable, an ether solvent, an ester solvent, a ketone solvent, and a petroleum solvent can be used in addition to the aprotic polar organic solvent. In addition, various solvents may be used as a mixture.

Examples of the ether solvent include ethylene glycol dialkyl ethers such as ethylene glycol dimethyl ether, ethylene glycol diethyl ether, and ethylene glycol dibutyl ether; polyethylene glycol dialkyl ethers such as diethylene glycol dimethyl ether, diethylene glycol diethyl ether, diethylene glycol dibutyl ether, triethylene glycol dimethyl ether, triethylene glycol diethylether, and triethylene glycol dibutyl ether; ethylene glycol monoalkyl ether acetates such as ethylene glycol monomethyl ether acetate, ethylene glycol monoethyl ether acetate, and ethylene glycol monobutyl ether acetate; polyethylene glycol monoalkyl ether acetates such as diethylene glycol monomethyl ether acetate, diethylene glycol monoethyl ether acetate, diethylene glycol monobutyl ether acetate, triethylene glycol monomethyl ether acetate, triethylene glycol monoethyl ether acetate, and triethylene glycol monobutyl ether acetate;

propylene glycol dialkyl ethers, such as propylene glycol dimethyl ether, propylene glycol diethyl ether, and propylene glycol dibutyl ether; polypropylene glycol dialkyl ether, such as dipropylene glycol dimethyl ether, dipropylene glycol diethyl ether, dipropylene glycol dibutyl ether, tripropylene glycol dimethyl ether, tripropylene glycol diethyl ether, and tripropylene glycol dibutyl ether; polypropylene glycol monoalkyl ether acetates, such as propylene glycol monomethyl ether acetate, propylene glycol monoethyl ether acetate and propylene glycol monobutyl ether acetate; polypropylene glycol monoalkyl ether acetates such as dipropylene glycol monomethyl ether acetate, dipropylene glycol monoethyl ether acetate, dipropylene glycol monobutyl ether acetate, tripropylene glycol monomethyl ether acetate, tripropylene glycol monoethyl ether acetate, and tripropylene glycol monobutyl ether acetate; dialkyl ethers of copolymerized polyether glycol, such as a low molecular ethylene-propylene copolymer; monoacetate monoalkyl ethers of copolymerized polyether glycol; alkyl esters of copolymerized polyether glycol; and monoalkylester monoalkyl ethers of copolymerized polyether glycol.

Examples of the ester solvent include ethyl acetate, and butyl acetate. Examples of the ketone solvent include acetone, methyl ethyl ketone, and cyclohexanone. Examples of the petroleum solvent include aromatic solvents such as toluene, xylene, and other solvents having a high boiling point, and aliphatic and alicyclic solvents, such as hexane, and cyclohexane.

The weight average molecular weight of the polyurethane resin (A) used in the present invention is preferably in a range from 800 to 50,000, and more preferably in a range from 1,000 to 20,000, because a thermosetting resin composition having excellent dissolubility to a solvent is obtained and a cured coated film having various excellent properties is also obtained.

The weight average molecular weight of the polyurethane resin (A) and the polyimide resin (C) used in the present invention was measured using gel permeation chromatography, and the obtained value was subjected to polystyrene conversion under the following conditions.

| | |
|---|---|
| Measuring device: | HLC-8220GPC made by TOSOH CORP. |
| Column: | Guard column SUPER HZ-H made by TOSOH CORP. + four TSKgel SUPER HZm-m made by TOSOH CORP. |
| Detector: | RI (differential refractometer) |
| Data processing: | GPC-8020 made by TOSOH CORP. |
| Measuring conditions: | Column temperature 40° C. |
| | Solvent tetrahydrofuran |
| | Rate of flow 0.35 ml/min |
| Standard: | polystyrene |
| Sample: | 100 ml of sample was obtained by making a tetrahydrofuran solvent containing a resin solid of 0.2% by weight and then filtering using a microfilter. |

The phenolic hydroxyl equivalent of the polyurethane resin (A) used in the present invention is preferably in a range from 400 to 50,000.

The polyimide resin (C) in the thermosetting resin composition of the present invention has a structure such that an isocyanate group and a phenolic hydroxyl group are connected as a urethane bond, represented by the general formula (1) and/or the general formula (2). The polyimide resin (C) is preferably dissolved in an organic solvent, because it is easy to handle.

Examples of the polyimide resin (C) having the structure represented by the general formula (1) include a polyimide resin having the structure represented by the general formula (3).

Examples of the polyimide resin (C) having the structure represented by the general formula (2) include a polyimide resin having the structure represented by the general formula (4).

In the general formulae (3) and (4), $Rx^1$ and $Rx^2$ may be identical or not.

When $Rx^1$ and $Rx^2$ in the general formula (3) correspond to $R^5$ in the general formula (15), a branched polyimide resin is obtained having a structure in which the structure represented by the general formula (1) is bonded to the structure represented by the general formula (15). When $Rx^1$ in the general formula (4) corresponds to $R^5$ in the general formula (15), a branched polyimide resin is obtained having a structure in which the structure represented by the general formula (2) is bonded to the structure represented by the general formula (15).

Examples of X in the general formulae (1) and/or (2), which the polyimide resin (C) has, include the structure represented by the general formulae (5), (6), (7), (9), and (10). Examples of $R^1$ and $R^2$ in the general formula (5), and $R^3$ in the general formula (7) include $R^1$, $R^2$, and $R^3$, which were explained for the polyurethane resin (A).

It is preferable that the polyimide resin (C) used in the present invention be a polyimide resin having at least one structure selected from the group represented by the general formulae (5), (6), (7), and (9) as X in the general formulae (1) and (2). Thereby, a thermosetting resin composition which can provide a cured material having excellent heat resistance is obtained. The polyimide resin (C) more preferably has a structure represented by the general formulae (5) and (6) as X in the general formulae (1) and (2). In addition, when the polyimide resin (C) has a structure which can provide flexibility to a cured material, such as the structure represented by the general formula (13) as explained below, it is preferable that X in the general formula (1) and/or (2) have the structure represented by the general formula (6).

As explained above, $R^1$ in the structure represented by the general formulae (5) and (6) is a single bond or a divalent connecting group. Examples of the divalent connecting group include the structures represented by the general formulae (1a), (1b), (1c), (1d), (1e), (1f), (1 g), (1h), and (1i).

When $R^1$ in the structure represented by the general formulae (5) and (6) has the structure represented by the general formulae (1b), (1c), or (1d), the polyimide resin (C) can provide a thermosetting resin composition having excellent compatibility. In addition, such a polyimide resin can be easily synthesized. Therefore, it is preferable that $R^1$ in the structure represented by the general formulae (5) and (6) have the structure represented by the general formulae (1b), (1c), or (1d). In addition, $R^2$ is preferably a hydrogen atom or a methyl group. In particular, it is preferable that $R^1$ in the structure represented by the general formula (6) have the structure represented by the general formula (1i), because a thermosetting polyimide resin composition having excellent heat resistance can be obtained.

The polyimide resin (C) used in the present invention has the structure represented by the general formula (1) and/or the general formula (2). In particular, it is preferable that the polyimide resin (C) have the structure represented by the general formulae (1) and (2), because the polyimide resin (C) can provide a thermosetting resin composition having excellent curing properties. Moreover, X in the structure represented by the structure represented by the general formulae (1) and (2) may be identical or not.

Examples of the polyimide resin having the structure represented by the general formula (6) include a polyimide resin having the following structure.

[Chemical formula 22]

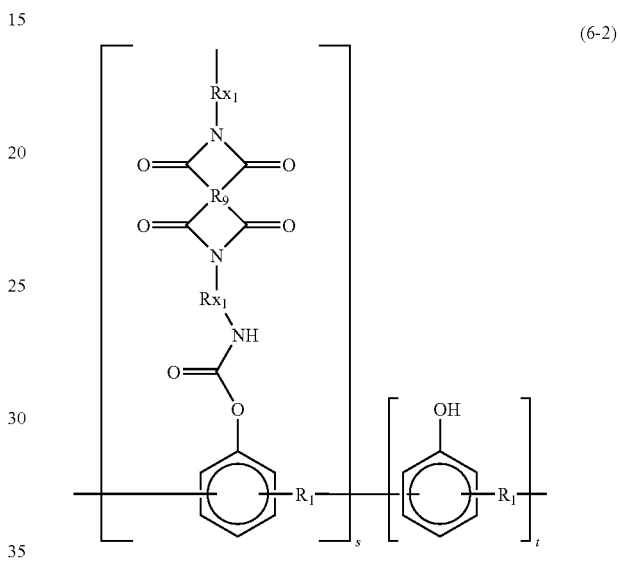

(6-2)

In the general formula, $R_1$ may be identical or not, as explained above. $Rx_1$ represents a residue in which two isocyanate groups are excluded from a polyisocyanate compound. $R_9$ represents a residual structure in which an acid anhydride group is excluded from a tetracarboxylic anhydride. s and t are each integers of 1 to 10, and each unit in parentheses attached with s or t is connected at random. When s is 1 (case 1), the obtained polyimide resin (C) has the polyphenol structure at the end of the structure represented by the general formula (2). When s is 2 (case 2), the obtained polyimide resin (C) has the polyphenol structure in the main chain. When s is 3 or more (case 3), the obtained polyimide resin (C) is branched. It is also possible for the states in cases 1, 2, and 3 to exist together in a molecule.

When s is 1 in the general formula (6-2), examples of the structure include the following structure.

[Chemical formula 23]

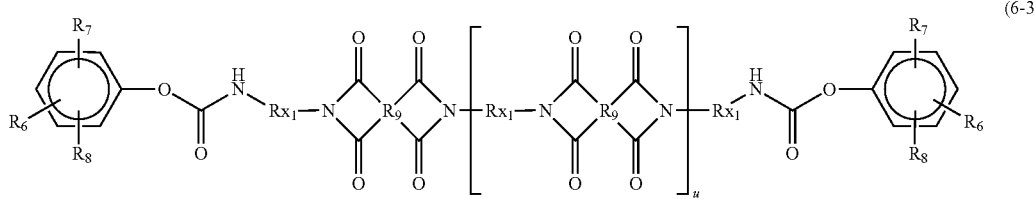

(6-3)

$R_6$ in the general formula (6-3) represents a hydrogen atom or an alkyl group having 1 to 18 carbon atoms. $R_7$ represents a hydrogen atom or a structure represented by the following general formula (6-4). $R_8$ represents a structure represented by the following general formula (6-4). u is an integer from 1 to 100.

[Chemical formula 24]

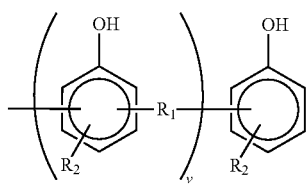

(6-4)

(In the general formula, $R_1$ represents a direct bonding or a divalent connecting group. $R_2$ may be identical or not, and represents a hydrogen atom or an alkyl group having 1 to 18 carbon atoms. v is an integer from 0 to 8.)

Representative examples of the structure represented by the general formula (6-2) wherein s is 2 include the structure represented by the following general formula (6-5).

[Chemical formula 25]

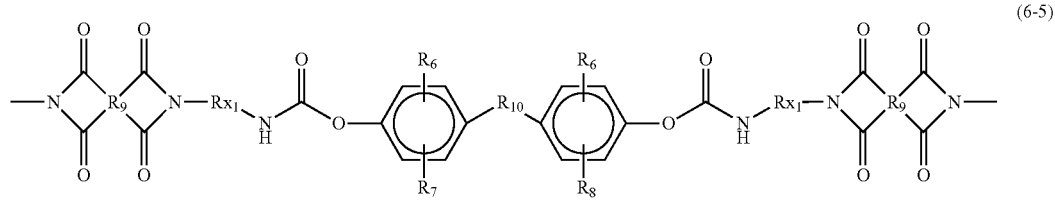

(6-5)

In the general formula (6-5), $R_{X1}$, $R_6$, $R_7$, $R_8$, and $R_9$ are the same as the above. $R_{10}$ has the structure represented by the following general formula (6-6).

[Chemical formula 26]

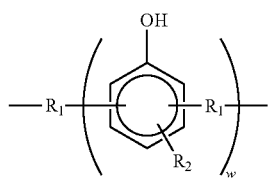

(6-6)

In the general formula (6-6), $R_1$ and R2 are the same as the above. w is an integer from 0 to 8.

In the general formulae (6-2), (6-3), (6-4), (6-5), and (6-6), when tetracarboxylic dianhydride is used to synthesize the polyimide resin (C), the part constituting an imide bonding has the structure represented by the following general formula (6-7). When a tricarboxylic anhydride is used, the part constituting an imide bonding has the following general formula (6-8) or (6-9). The structures represented by the general formulae (6-7), (6-8), and (6-9) may be used alone, or may be combined.

[Chemical formula 27]

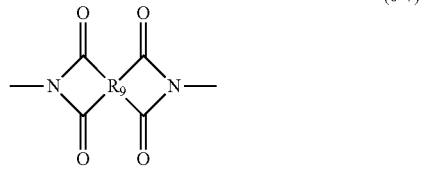

(6-7)

[Chemical formula 28]

(6-8)

-continued

[Chemical formula 29]

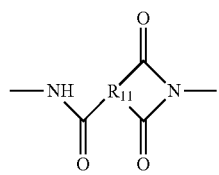

(6-9)

$R_9$ represents a residual structure in which an acid anhydride group is excluded from a tetracarboxylic anhydride. $R_{11}$ represents a residual structure in which an acid anhydride group and a carboxyl group are excluded from a tricarboxylic anhydride.

Examples of the polyimide resin (C) having the structure represented by the general formulae (1) and (2) include the polyimide resin having the structure represented by the following general formula (12-1).

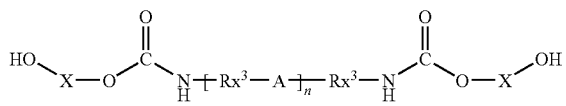

(12-1)

In the general formula (12-1), X and $Rx^3$ are the same as the above. A in the general formula (12-1) represents the structure selected from the group consisting of the general formulae (1), (6-7), (6-8), and (6-9). However, A is not represented by only general formula (1). N is an integer from 1 to 100.

When $Rx^1$ and $Rx^2$ in the general formulae (3) and (4), which constitute the polyimide resin (C), are residues in which two isocyanate groups are excluded from a divalent diisocyanate compound, a linear polyimide resin having the structure represented by the general formula (12) can be obtained. When $Rx^1$ and $Rx^2$ are residues in which two isocyanate groups are excluded from a trivalent or greater compound, a branched polyimide resin can be obtained.

The polyimide resin (C) having the structure represented by the general formula (2) has a phenolic hydroxyl group at the end. Therefore, it is possible to react with an epoxy resin (B), which is explained below, and curingeneral, a cured material of a phenol compound and an epoxy resin has limited glass transition temperature (Tg), heat resistance, dielectric properties, mechanical properties, and linear expansion rate. However, since the polyimide resin having the structure represented by the general formula (2) has an imide structure in the main chain, it is possible to provide a cured material having high performance, which is not obtained by a conventional resin composition.

The polyimide resin (C) has a urethane bond which is made of a phenolic hydroxyl group and an isocyanate group represented by the general formula (1) and/or (2). In general, a urethane bond made of a phenolic hydroxyl group and an isocyanate group has a low dissociation temperature. Therefore, a low molecular monophenolic compound, such as phenol and cresol, may be used as a blocking agent to an isocyanate group. However, the blocking agent is dissociated and becomes a volatile component in a curing reaction of a coated film or a molded article. The volatile component generates air bubbles or voids. Therefore, use of the blocking agent is not preferable. In the present invention, a phenolic hydroxyl group is introduced using a polyphenolic compound having two or more functional groups. Therefore, even if the urethane bond is dissociated from the resin under high temperatures, it is not vaporized, and remains in the system. Due to this, the polyimide resin (C) is positively crosslinked with an epoxy resin, and becomes further cured. The isocyanate group further conducts a urethanization reaction with a hydroxyl group which is generated by the reaction of the phenolic hydroxyl group and an epoxy group to further produce a crosslinking structure. Thereby, hydroxyl groups having adverse affect on dielectric properties are blocked. In other words, the inventors of the present invention believe that the produced urethane bond forms a further network connecting a rigid imide structure of the resin skeleton, and thereby excellent heat resistance and mechanical properties are achieved.

When the polyimide resin having the structure represented by the general formula (2) is used as the polyimide resin (C) used in the present invention, a phenolic hydroxyl group at the end also reacts with an epoxy resin, and the polyimide resin is cured.

When the polyimide resin having the structure represented by the general formula (13) is used as polyimide resin (C) for a thermosetting resin composition of the present invention, a cured material which has an excellent elongation rate and flexibility is obtained. Therefore, the thermosetting resin composition containing the polyimide resin having the structure represented by the following general formula (13) is preferably used as a resin composition for an insulating layer used in a flexible substrate.

In particular, when dielectric properties of a coated film are desired to be improved in addition to the flexibility, it is preferable that Y in the general formula (13) be a residue in which two hydroxyl groups are excluded from a polyolefin polyol having at least two alcoholic hydroxyl groups in the molecule. When the physical properties and hydrolysis resistance are desired to be improved, it is preferable that Y be a residue in which two hydroxyl groups are excluded from a polycarbonate polyol having at least two alcoholic hydroxyl groups in the molecule.

The number average molecular weight of Y in the general formula (13) is preferably in a range from 300 to 5,000, and more preferably in a range from 500 to 3,000, because the elongation rate of the cured material is large and excellent flexibility can be obtained. In addition, the glass transition temperature (Tg) of Y is preferably 0° C. or less, and more preferably in a range from 0 to −150° C.

Examples of the polyimide resin having the structure represented by the general formulae (1) and/or (2), and (13) include a polyimide resin having the structure represented by the following general formula (14-1).

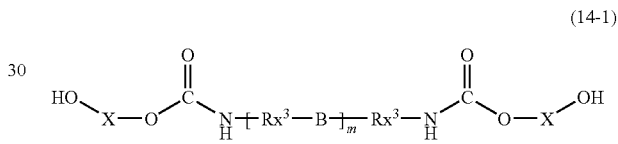

(14-1)

(In the general formula (14-1), B represents a structure represented by the general formula selected from the general formulae (1), (6-7), (6-8), (6-9), and (13); however B always represents a structure having at least one of the structures selected from the group consisting of the general formulae (6-7), (6-8), and (6-9), and the structure represented by the general formula (13). m is an integer from 1 to 100.

The polyimide resin (C) has the structure represented by the general formula (1) and/or (2). However, the polyimide resin (C) having the structure represented by the general formula (1) and the structure represented by the general formula (2) is more preferable, because the polyimide resin (C) provides a cured material which has excellent hardenability and heat resistance.

In addition, the polyimide resin having the structure represented by the general formula (13) may also have the structure represented by the general formula (1) and/or (2). In particular, the polyimide resin having the structure represented by all the general formulae (1), (2), and (13) is preferable, because the polyimide resin provides a cured material which has excellent flexibility and heat resistance. Moreover, X in the structure represented by the general formulae (1) and (2) may be identical or not.

It is preferable that the polyimide resin (C) used in the present invention be a branched polyurethane resin having the structure represented by the following general formula (15), because the polyimide resin has improved compatibility with other resins, solubility in a solvent, and can realize improved heat resistance of a cured coated film.

The polyimide resin (C) used in the present invention preferably has an imide bond represented by the general formula (16), (17-1), or (17-2).

[Chemical formula 30]

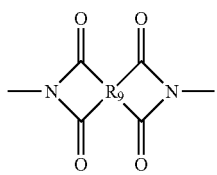
(16)

[Chemical formula 31]

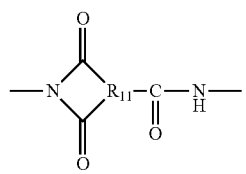
(17-1)

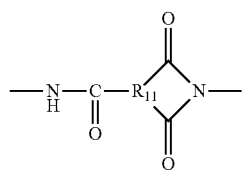
(17-2)

$R_9$ in the general formula (16) represents a residual structure in which an acid anhydride group is excluded from a tetracarboxylic anhydride. $R_{11}$ in the general formulae (17-1) and (17-2) represents a residual structure in which an acid anhydride group and a carboxyl group are excluded from a tricarboxylic anhydride.

As explained above, $R_9$ represents a residual structure in which an acid anhydride group is excluded from a tetracarboxylic anhydride. Examples of $R_9$ include the following structures.

[Chemical formula 32]

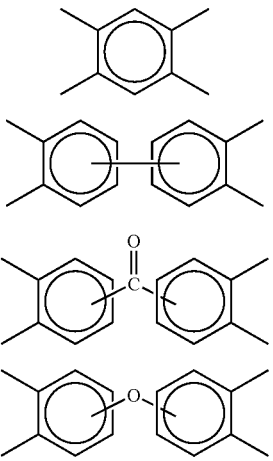

(R6-1)
(R6-2)
(R6-3)
(R6-4)
(R6-6)

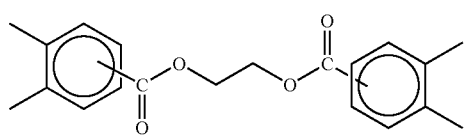

(R6-7)

As explained above, $R_{11}$ represents a residual structure in which an acid anhydride group and a carboxyl group are excluded from a tricarboxylic anhydride. Examples of $R_{11}$ include the following structures.

[Chemical formula 33]

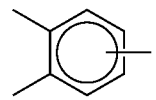
(R7-1)

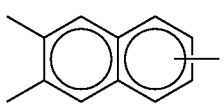
(R7-2)

Examples of the polyimide resin having the structure represented by the general formula (16) include a polyimide resin having the structure represented by the general formula (18).

[Chemical formula 34]

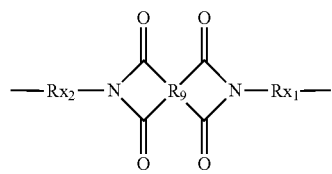
(18)

(In the general formula, $R_{x1}$ and $R_{x2}$ may be identical or not, and represent a residue in which two isocyanate groups are excluded from a polyisocyanate compound. $R_9$ represents a residual structure in which an acid anhydride group is excluded from a tetracarboxylic anhydride.)

When $R_{x1}$ and/or $R_{x2}$ in the general formula (18) correspond to $R^5$ in the general formula (15), the polyimide resin is a branched polyimide resin having the structure in which the general formula (18) is combined with the general formula (15).

Examples of the polyimide resin having the structure represented by the general formula (17-1) include a polyimide resin having the structure represented by the following general formula (19-1) or (19-2).

[Chemical formula 35]

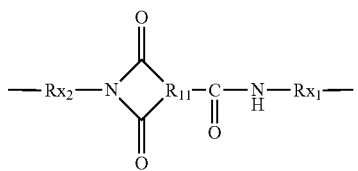
(19-1)

-continued

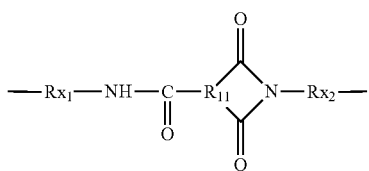
(19-2)

(In the General Formulae, $R_{x1}$, $R_{x2}$, and $R_{11}$ are the same as the above.)

When $R_{x1}$ and/or $R_{x2}$ in the general formula (19) correspond to $R^5$ in the general formula (15), the polyimide resin is a branched polyimide resin having the structure in which the general formula (19) is combined with the general formula (15).

It is preferable that the polyimide resin (C) used in the present invention be a branched polyimide resin having the structure represented by the general formula (15), because the branched polyimide resin has excellent compatibility with other resin components, solubility to a solvent, and provides a cured coated film having excellent heat resistance.

Examples of $R^5$ in the general formula (15) include residual structures, such as a residual structure of an aromatic compound, a residual structure of an aliphatic compound, and a residual structure of an alicyclic compound. Especially, the residual structures having carbon atoms of 4 to 13 are preferable. It is more preferable that $R^5$ have two or more structures, in order to prevent crystallization, and improve solubility. In addition, it is most preferable that $R_5$ have both the residual structure of an aromatic compound and the residual structure of an aliphatic compound or an alicyclic compound.

For example, the polyimide resin (C) used in the present invention can be easily obtained by a production method in which a polyphenol compound (a1) having two or more phenolic hydroxyl groups, a polyisocyanate compound (a2), and an acid anhydride (a4) are reacted.

Examples of the polyphenol compound (a1) having two or more phenolic hydroxyl groups include the compounds used in preparing the polyurethane resin (A). When a polyphenol compound having two or more phenolic hydroxyl groups, that is, a bifunctional polyphenol compound is used to prepare the polyimide resin (C) as the polyphenol compound (a1), bisphenol compounds, such as bisphenol A, bisphenol F, and bisphenol S are preferably used.

In addition, trifunctional or more polyphenol compounds, for example, alkylphenol novolacs, such as phenol novolac, cresol novolac, and nonyl phenol novolac, and xylok type polyphenol resins can also be used in addition to the polyphenol compounds having two phenolic hydroxyl groups. Furthermore, a monofunctional phenol compound such as phenol and cresol can also be used as long as it does not deteriorate the effects of the present invention.

Examples of the polyisocyanate compound (a2) include the compounds used to produce the polyurethane resin (A).

It is preferable that the polyimide resin (C) used in the present invention have a branched structure, because solubility in a solvent and compatibility with a curing agent or other resin components can be improved. In order to make a branched structure, it is preferable to use only a polyisocyanate compound having an isocyanurate ring, such as an isocyanurate of a diisocyanate compound, or a mixture containing such a polyisocyanate compound and the diisocyanate compound.

Examples of the polyisocyanate compound having an isocyanurate ring include the compounds which are used to produce the polyurethane resin (A).

When using both a diisocyanate compound and a diisocyanate compound having an isocyanurate ring as the polyisocyanate compound (a2), a mixture is preferably used, which contains an aromatic diisocyanate as the diisocyanate compound, and isocyanurate type polyisocyanate of an aliphatic diisocyanate and/or isocyanurate type polyisocyanate of a cycloaliphatic diisocyanate as the isocyanurate type polyisocyanate.

When an aliphatic diisocyanate compound is used as the polyisocyanate compound (a2) to produce the polyimide resin (C), a thermosetting polyurethane resin composition having excellent solubility, and a cured coated film having excellent electric properties can be obtained. Therefore, it is preferable to use an aliphatic diisocyanate compound as the polyisocyanate compound (a2).

It is preferable to use two or more kinds of the polyisocyanate compounds as the polyisocyanate compound (a2) used to produce the polyimide resin (C). Thereby, a thermosetting polyimide resin composition having excellent solubility to a solvent can be obtained.

In addition, it is also preferable to use the isocyanurate at the same time. Thereby, a cured coated film having excellent heat resistance can be obtained. When the isocyanurate is used at the same time, the content of the isocyanurate is preferably 70% by weight relative to the total amount of the polyisocyanate compound (a2). Thereby, an increase of the molecular weight or gelatification of the obtained polyurethane resin (A) can be prevented.

Examples of the acid anhydride (a4) include an acid anhydride having one acid anhydride group, and an acid anhydride having two acid anhydride groups. Examples of the acid anhydride having one acid anhydride group include aromatic tricarboxylic anhydrides, such as trimellitic anhydride and naphthalene-1,2,4-tricarboxylic anhydride.

Examples of the acid anhydride having two acid anhydride groups include pyromellitic dianhydride, benzophenone 3,3',4,4'-tetracarboxylic dianhydride, diphenyl ether-3,3',4,4'-tetracarboxylic dianhydride, benzene-1,2,3,4-tetracarboxylic dianhydride, biphenyl-3,3',4,4'-tetracarboxylic dianhydride, biphenyl-2,2',3,3'-tetracarboxylic dianhydride, naphthalene-2,3,6,7-tetracarboxylic dianhydride, naphthalene-1,2,4,5-tetracarboxylic dianhydride, naphthalene-1,4,5,8-tetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,3,9,10-tetracarboxylic dianhydride, berylene-3,4,9,10-tetracarboxylic dianhydride, bis(2,3-dicarboxyphenyl)methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 2,2-bis(2,3-dicarboxyphenyl)propane dianhydride, 2,3-bis(3,4-dicarboxyphenyl)propane dianhydride, bis(3,4-dicarboxyphenyl)sulfone dianhydride, bis(3,4-dicarboxyphenyl)ether dianhydride, and alkylene glycol bisanhydroxytrimellitates such as ethylene glycol bisanhydrotrimellitate, propylene glycol bisanhydrotrimellitate, butanediol bisanhydrotrimellitate, hexamethylene glycol bisanhydrotrimellitate, polyethylene glycol bisanhydrotrimellitate, and polypropylene glycol bisanhydrotrimellitate.

Among these, pyromellitic dianhydride, benzophenone-3,3',4,4'-tetracarboxylic dianhydride, diphenyl ether-3,3',4,4'-tetracarboxylic dianhydride, biphenyl-3,3',4,4'-tetracarboxylic dianhydride, biphenyl-2,2,3,3'-tetracarboxylic dianhydride, and ethylene glycol bisanhydrotrimellitate are preferably used.

It is possible to use two or more acid anhydrides (a4). In addition, a mixture containing an aromatic tricarboxylic dianhydride, and an aromatic tricarboxylic anhydride and/or an aromatic tetracarboxylic monoanhydride may also be used.

As explained above, the polyimide resin (C) used in the thermosetting resin composition of the present invention can be obtained by a production method in which the polyphenol compound (a1) having two or more phenolic hydroxyl groups, the polyisocyanate compound (a2), and an acid anhydride (a4) are reacted.

In the production method of the polyimide resin, the polyphenol compound (a1) and the acid anhydride (a4) react with the polyisocyanate compound (a2). In order to retain a phenolic hydroxyl group at the end of the polyimide resin (C), it is preferable that they are reacted under conditions in which the total number of moles of the phenolic hydroxyl group in the polyphenol compound (a1) and the number of moles of the acid anhydride group in the acid anhydride (a4) are larger than the number of moles of the isocyanate group in the polyisocyanate compound (a2). When stability of synthesis and various characteristics of a cured material are taken into consideration, the ratio [{the number of moles of the phenolic hydroxyl group in the (a1)+the number of moles of the acid anhydride group of the acid anhydride (a4)}/the number of moles of the isocyanate group in the (a2)] is preferably in a range from 1 to 10, and more preferably in a range from 1.1 to 7. In addition, the weight amount of the each polyphenol compound (a1) and the acid anhydride (a4) is preferably 5% or more, and more preferably 10% or more relative to the total weight amount of the polyphenol compound (a1) and the acid anhydride (a4).

The polyimide resin (C) used in the present invention may be produced by a reaction containing one step, or a reaction containing two or more steps.

For example, when the polyimide resin (C) is produced by the reaction containing one step, a raw material containing the polyphenol compound (a1), the polyisocyanate compound (a2), and the acid anhydride (a4) is put into a reaction vessel, and they are reacted by carrying out a decarboxylation while raising the temperature and stirring.

For example, when the polyimide resin (C) is produced by the reaction containing two or more steps, the acid anhydride (a4) is put in a reaction vessel in the presence of the polyisocyanate compound (a2), and they are reacted. During or after the reaction, the remaining isocyanate group and phenolic hydroxyl group in the polyphenol compound (a1) are reacted. In addition, it is also possible to react the polyphenol compound (a1) and the polyisocyanate compound (a2), and during or after the reaction, the acid anhydride (a4) be put into the reaction system.

Furthermore, it is also possible to put the acid anhydride (a4) in a reaction vessel in the presence of the polyphenol compound (a1) to react them, and during or after the reaction, the remaining isocyanate group is reacted with the acid anhydride (a4).

The reaction may be performed in a range from 50 to 250° C. From the viewpoint of the reaction rate and prevention of a side reaction, the reaction is preferably performed in a range from 70 to 180° C.

In the production method of the polyimide resin, it is preferable that the content of the polyphenol compound (a1) having two or more phenolic hydroxyl groups, the polyisocyanate compound (a2) and the acid anhydride (a4) relative to the total amount of the (a1), (a2), and (a4) be respectively in a range from 5 to 50% by weight, 20 to 70% by weight, and 20 to 70% by weight.

It is preferable that the reaction be performed completely until almost all the isocyanate is reacted, because the obtained polyimide resin (C) has excellent stability. In addition, it is also possible to add alcohol or a phenol compound in small amount of remaining isocyanate to react them.

The polyimide resin (C) further having the structure represented by the general formula (13) is easily obtained by a production method in which the polyphenol compound (a1) having two or more phenolic hydroxyl groups, the polyisocyanate compound (a2), the acid anhydride (a4), and further the polyol compound (a3) are reacted. Examples of the production method include the following methods.

1. A method in which the acid anhydride (a4) is mixed with the polyisocyanate compound (a2), and, during or after the imidation reaction, the remaining isocyanate group and the phenolic hydroxyl group in the polyphenol compound (a1) and the alcoholic hydroxyl group in the polyol compound (a3) are reacted to urethanize.

2. A method in which the polyphenol compound (a1), the polyol compound (a3), and the polyisocyanate compound (a2) are mixed, and, during or after the urethanization reaction, the remaining isocyanate group and the acid anhydride group of the acid anhydride (a4) are reacted to imidize.

3. A method in which the acid anhydride (a4) is mixed with the polyphenol compound (a1) and/or the polyol compound (a3), and, during or after the reaction, the polyisocyanate compound (a3) is added to imidize and urethanize.

4. A method in which the polyisocyanate compound (a2) and the polyol compound (a3) are mixed to urethanize, then the polyphenol compound (a1) is added to further urethanize, and after that, the acid anhydride (a4) is added to imidize the remaining isocyanate group and the acid anhydride group.

5. A method in which the polyisocyanate compound (a2) and the polyol compound (a3) are mixed to urethanize, and after that, the polyphenol compound (a1) and the acid anhydride (a4) are added to imidize the isocyanate group and the acid anhydride group and urethanize polyisocyanate compound (a2) and the polyphenol compound (a1).

6. A method in which the polyisocyanate compound (a2) and the polyol compound are mixed to urethanize, and after that, the acid anhydride (a4) is added to imidize the isocyanate group and the acid anhydride group, and the polyphenol compound (a1) is added to react.

Among these production methods, method 6 is preferable because the possibility of obtaining the polyimide resin which has the polyphenol compound at the end is high and hardenability of the resin composition containing the epoxy resin (B) can be improved.

The reaction between the polyphenol compound (a1) having two or more phenolic hydroxyl groups, the polyisocyanate compound (a2), the polyol compound (a3), and the acid anhydride (a4) may be performed in a range from 50 to 250° C. The temperature is preferably in a range from 70 to 180° C. when the reaction speed and the prevention of a side reaction are concerned.

In the production method, it is preferable that the content of the polyphenol compound (a1) having two or more phenolic hydroxyl groups, the polyisocyanate compound (a2), the polyol compound (a3), and the acid anhydride (a4) relative to the total amount of the (a1), (a2), (a3), and (a4) be respectively in a range from 5 to 50% by weight, 10 to 70% by weight, 10 to 70% by weight, and 10 to 70% by weight.

It is preferable that the reaction be performed completely until almost all the isocyanate is reacted, because the obtained polyimide resin (C) has excellent stability. In addition, it is also possible to add alcohol, a phenol compound, or an oxime compound in small amount of remaining isocyanate to react them.

It is preferable to use an organic solvent in a production method of the polyimide resin (C). Thereby, a uniform reaction can be performed. Examples of the organic solvent used include the organic solvents used in producing the polyurethane resin (A). The organic solvent may be added to the reaction system in advance, or in the middle of the reaction. In order to maintain adequate reaction speed, the ratio of the organic solvent in the reaction system is preferably 80% by weight or less of the reaction system, and more preferably in a range from 10 to 70% by weight.

The weight average molecular weight of the polyimide resin (C) used in the present invention is preferably in a range from 800 to 50,000, and more preferably in a range from 1,000 to 20,000, because a thermosetting resin composition having excellent dissolubility in a solvent is obtained and a cured coated film having various excellent properties is also obtained.

The phenolic hydroxyl equivalent of the polyimide resin (C) used in the present invention is preferably in a range from 400 to 10,000.

The epoxy resin (B) used in the present invention preferably has two or more epoxy groups in its molecule. Examples of the epoxy resin include bisphenol type epoxy resin, such as bisphenol A type epoxy resin, bisphenol S type epoxy resin, and bisphenol F type epoxy resin; novolac type epoxy resin, such as phenol novolac type epoxy resin, cresol novolac type epoxy resin, biphenyl type novolac epoxy resins; epoxidized dicyclopentadiene-modified phenol resins obtained by reacting dicyclopentadiene and phenol resin; biphenyl type epoxy resin such as epoxidized 2,2',6,6'-tetramethyl biphenol; epoxy resin having a naphthalene skeleton; aromatic epoxy resin such as epoxy resin having a fluorene skeleton, and hydrogenated resins thereof; aliphatic epoxy resin such as neopentyl glycol diglycidyl ether, and 1,6-hexanediol diglycidyl ether; alicyclic epoxy resin such as 3,4-epoxycyclohexylmethyl-3,4-epoxy cyclohexane carboxylate, and bis-(3,4-epoxycyclohexyl)adipate; epoxy resin having a hetero ring such as triglycidyl isocyanurate. Especially, aromatic epoxy resin is preferable, because a thermosetting polyurethane resin composition having excellent mechanical properties can be obtained.

The content ratio ((A)/(B)) in weight between the polyurethane resin (A) and the epoxy resin (B) is preferably in a range from 1/100 to 50/1, and more preferably in a range from 1/10 to 20/1.

In addition, the content ratio ((C)/(B)) in weight between the polyimide resin (C) and the epoxy resin (B) is preferably in a range from 1/100 to 50/1, and more preferably in a range from 1/10 to 20/1.

The thermosetting resin composition in the present invention further contains a compound which reacts with the phenolic hydroxyl group of the polyurethane resin (A) or the polyimide resin (C). Examples of the compound include epoxy compounds other than the epoxy resin (B), isocyanate compounds, silicates, and alkoxy silane compounds.

Examples of the isocyanate compound include an aromatic isocyanate compound, an aliphatic isocyanate compound, and an alicyclic isocyanate compound. A polyisocyanate compound having two or more isocyanate groups is preferable. In addition, a block isocyanate compound can also be used.

The thermosetting resin composition of the present invention can further contain a binder resin, such as polyester, polyimide resin, phenoxy resin, PPS resin, PPE resin, and polyarylene resin, a curing agent or a reactive compound, such as phenol resin, melamine resin, alkoxysilane curing agents, polybasic acid anhydride, and cyanate compounds, curing catalysts or curing accelerators, such as melamine, dicyandiamide, guanamine, and its derivatives, imidazoles, amines, phenols having one hydroxyl group, organic phosphines, phosphonium salts, quaternary ammonium salts, and an optical cationic catalyst, fillers, and other additives.

It is preferable to use a urethanization catalyst as the curing accelerator at the same time. Examples of the urethanization catalyst include 1,8-diazabicyclo[5,4,0]undecene-7 (abbreviated as "DBU" below) and organic salt compounds thereof, alkyl esters of dialkyl tin, such as triethylene diamine, dibutyltin diacetate, and dibutyltin dilaurate, and carboxylate of bismuth.

There is no limitation in the production method of the thermosetting resin composition of the present invention. The components may be mixed mechanically. The components may also be heated and melted to mix, and diluted with a solvent to mix.

The thermosetting resin composition of the present invention can contain additives such as fillers, an organic pigment, an inorganic pigment, an extender pigment, a rust-proofer. These may be used alone or in combination of two or more.

Examples of the filler include barium sulfate, barium titanate, acid powder of silicon oxide, silicon oxide fine particles, silica, talc, clay, magnesium carbonate, calcium carbonate, aluminum oxide, and aluminum hydroxide, and mica.

Examples of the organic pigment include azo pigments; copper phthalocyanine pigment such as phthalocyanine•blue, and phthalocyanine•greens, and quinacridone pigments.

Examples of the inorganic pigment include chromate salts such as chrome yellow, zinc chromate, and molybdate•orange; ferrocyanides such as Prussian blue, titanium oxide, zinc oxide, red iron oxide, and iron oxide; metallic oxides such as chromium carbide green, cadmium yellow, and cadmium red; metallic sulfides such as mercury sulfide, and selenide; sulfates such as lead sulfate; silicates such as ultramarine blue; carbonates, cobalt violet; phosphates such as manganese violet; metal powders such as aluminium powder, zinc powder, brass powder, magnesium powder, iron powder, copper powder, and nickel powder; and carbon black.

In addition, it is also possible to use other pigments, antirust, and an extender. These may be used alone or in combination of two or more.

The thermosetting resin composition of the present invention is usually coated on a film-shaped substrate made of an organic component, an inorganic-metal component, or a textile substrate such as glass fabric, and polyaramide cloth by an appropriate method such as a casting method, impregnation method, and coating method. The curing temperature is in a range from 80 to 300° C., and the curing time is in a range from 20 minutes to 5 hours.

EXAMPLES

Below, the present invention will be explained in detail referring to Examples and Comparative Examples. Moreover, "part" and "%" below mean "part by weight and "% by weight" unless otherwise noted.

Synthetic Example 1

Production of the Polyurethane Resin (A)

57 g of γ-butyrolactone, 80.8 g (0.4 mol) of BPF (bisphenol F), and 52.2 g (0.3 mol) of TDI (tolylene diisocyanate) were put into a flask provided with a stirrer, a thermometer, and a condenser. Then, the temperature was raised to 80° C. with stirring while paying attention to heat generation, and the reaction was conducted at this temperature for 5 hours. After the reaction, the solid concentration of the solution was adjusted to 60% using γ-butyrolactone, and thereby a clear and colorless solution of the polyurethane resin (A-1) having the viscosity of 180 Pa·s at 25° C. was obtained.

The obtained solution of the polyurethane resin (A-1) was coated on a KBr board. After evaporating the solvent, the infrared absorption spectrum of the sample was measured. As a result, a peak at 2270 cm$^{-1}$, which is the characteristic absorption of an isocyanate group, disappeared completely. Thereby, it was confirmed that the isocyanate group formed a urethane bond together with the hydroxyl group of BPF, and a polyurethane resin which had a residue excluding the hydroxyl group from BPF in its skeleton, and the hydroxyl group of BPF at the end was obtained.

Synthetic Example 2

Production of the Polyurethane Resin (A)

200 g of γ-butyrolactone, 121 g (0.5 mol) of TMBP (tetramethyl bisphenol), and 69.6 g (0.4 mol) of TDI were put into a flask provided with a stirrer, a thermometer, and a condenser. Then, the temperature was raised to 90° C. with stirring while paying attention to heat generation, and the reaction was conducted at this temperature for 7 hours. After the reaction, a transparent and orange liquid was obtained. Then, the solid concentration of the solution was adjusted to 40% using γ-butyrolactone, and thereby a solution of the polyurethane resin (A-2) having the viscosity of 6.2 Pa·s at 25° C. was obtained.

The obtained solution of the polyurethane resin (A-2) was coated on a KBr board. After evaporating the solvent, the infrared absorption spectrum of the sample was measured. As a result, a peak at 2270 cm$^{-1}$, which is the characteristic absorption of an isocyanate group, disappeared completely. Thereby, it was confirmed that the isocyanate group formed a urethane bond together with the hydroxyl group of TMBP, and a polyurethane resin which had a residue excluding the hydroxyl group from TMBP in its skeleton, and the hydroxyl group of BPF at the end was obtained.

Synthetic Example 3

Production of the Polyurethane Resin (A)

200 g of γ-butyrolactone, 93 g (0.5 mol) of BP (biphenol), and 69.6 g (0.4 mol) of TDI were put into a flask provided with a stirrer, a thermometer, and a condenser. Then, the temperature was raised to 90° C. with stirring while paying attention to heat generation, and the reaction was conducted at this temperature for 7 hours. After the reaction, a slightly cloudy and colorless liquid was obtained. Then, the solid concentration of the solution was adjusted to 38% using γ-butyrolactone, and thereby a solution of the polyurethane resin (A-3) having the viscosity of 2.8 Pa·s at 25° C. was obtained.

The obtained solution of the polyurethane resin (A-3) was coated on a KBr board. After evaporating the solvent, the infrared absorption spectrum of the sample was measured. As a result, a peak at 2270 cm$^{-1}$ which is the characteristic absorption of an isocyanate group was disappeared completely. Thereby, it was confirmed that the isocyanate group formed a urethane bond together with the hydroxyl group of BF, and a polyurethane resin which had a residue excluding the hydroxyl group from BP in its skeleton, and the hydroxyl group of BP at the end was obtained.

Synthetic Example 4

Production of the Polyurethane Resin (A)

200 g of γ-butyrolactone, 162 g (0.5 mol) of HCA-HQ (the reactant of 9,10-dihydro-9-oxa-10-phosphorphenanthrene-10-oxide and quinone: made by Sanko Co., Ltd.), and 100 g (0.4 mol) of MDI (diphenylmethane diisocyanate) were put into a flask provided with a stirrer, a thermometer, and a condenser. Then, the temperature was raised to 90° C. with stirring while paying attention to heat generation, and the reaction was conducted at this temperature for 7 hours. After the reaction, a transparent and brown liquid was obtained. Then, the solid concentration of the solution was adjusted to 40% using γ-butyrolactone, and thereby a solution of the polyurethane resin (A-4) having the viscosity of 10.2 Pa·s at 25° C. was obtained.

The obtained solution of the polyurethane resin (A-4) was coated on a KBr board. After evaporating the solvent, the infrared absorption spectrum of the sample was measured. As a result, a peak at 2270 cm$^{-1}$ which is the characteristic absorption of an isocyanate group was disappeared completely. Thereby, it was confirmed that the isocyanate group formed a urethane bond together with the hydroxyl group of HCA-HQ, and a polyurethane resin which had a residue excluding the hydroxyl group from HCA-HQ in its skeleton, and the hydroxyl group of HCA-HQ at the end was obtained.

Synthetic Example 5

Production of the Polyurethane Resin (A)

295 g of γ-butyrolactone, 175 g (0.7 mol) of BPS (bisphenol S), 69.9 g (0.3 mol as an isocyanate group) of IPDI-N (isocyanuration trimer of isophorone diisocyanate; NCO %: 18.03%), and 50 g (0.2 mol) of MDI were put into a flask provided with a stirrer, a thermometer, and a condenser. Then, the temperature was raised to 90° C. with stirring while paying attention to heat generation, and the reaction was conducted at this temperature for 7 hours. After the reaction, a transparent and colorless liquid was obtained. Thereby, a solution of the polyurethane resin (A-5) having the nonvolatile component of 50%, and the viscosity of 5.2 Pa·s at 25° C. was obtained.

The obtained solution of the polyurethane resin (A-5) was coated on a KBr board. After evaporating the solvent, the infrared absorption spectrum of the sample was measured. As a result, a peak at 2270 cm$^{-1}$ which is the characteristic absorption of an isocyanate group was disappeared completely. Thereby, it was confirmed that the isocyanate group formed a urethane bond together with the hydroxyl group of BPS, and a polyurethane resin which had a residue excluding the hydroxyl group from BPS in its skeleton, and the hydroxyl group of BPS at the end was obtained.

Synthetic Example 6

Production of the Polyurethane Resin (A)

265.2 g of γ-butyrolactone, 64 g (0.4 mol) of 1-6ND (1,6-dihydroxynaphthalene), 96.8 g (0.4 mol) of TMBP, and 104.4 g (0.6 mol) of TDI were put into a flask provided with a stirrer, a thermometer, and a condenser. Then, the temperature was raised to 90° C. with stirring while paying attention to heat generation, and the reaction was conducted at this temperature for 7 hours. After the reaction, a transparent and dark brown liquid was obtained. Then, the solid concentration of the solution was adjusted to 40% using γ-butyrolactone, and thereby a solution of the polyurethane resin (A-6) having the viscosity of 2.6 Pa·s at 25° C. was obtained.

The obtained solution of the polyurethane resin (A-6) was coated on a KBr board. After evaporating the solvent, the infrared absorption spectrum of the sample was measured. As a result, a peak at 2270 $cm^{-1}$ which is the characteristic absorption of an isocyanate group was disappeared completely. Thereby, it was confirmed that the isocyanate group formed a urethane bond together with the hydroxyl group of 1-6ND and TMBP, and a polyurethane resin which had a residue excluding the hydroxyl group from 1-6ND and TMBP, and the hydroxyl group of 1-6ND and/or TMBP at the end was obtained.

Synthetic Example 7

Production of the Polyurethane Resin (A)

1188 g of γ-butyrolactone, 618 g (6 mol as a phenolic hydroxyl group) of phenol novolac resin (softening point: 90° C., phenolic hydroxyl equivalent: 103 g/eq.) were put into a flask provided with a stirrer, a thermometer, and a condenser. Then, the temperature was raised to 80° C. to dissolve. After that, 174 g (1 mol) of TDI was separately added over 1 hour, the temperature was raised to 90° C., and the reaction was conducted for a further 7 hours. After the reaction, a transparent and thick yellow liquid was obtained. Thereby, a solution of the polyurethane resin (A-7) having the nonvolatile component of 40%, the viscosity of **** Pa·s at 25° C. was obtained.

The obtained solution of the polyurethane resin (A-7) was coated on a KBr board. After evaporating the solvent, the infrared absorption spectrum of the sample was measured. As a result, a peak at 2270 $cm^{-1}$ which is the characteristic absorption of an isocyanate group was disappeared completely. Thereby, it was confirmed that the isocyanate group formed a urethane bond together with the phenolic hydroxyl group of the phenol novolac resin, and a polyurethane resin which had the phenolic hydroxyl group of the phenol novolac resin in its skeleton, and in which a part of the phenolic hydroxyl group was modified with the urethane bond was obtained.

Synthetic Example 8

Production of the Polyurethane Resin (A)

50.6 g of γ-butyrolactone, 101.2 g of solvesso 150 (an aromatic hydrocarbon solvent), 85.9 g (0.298 mol as a phenolic hydroxyl group) of a nonyl phenol novolac resin solution (hydroxyl equivalent: 288 g/eq., mineral spirits solution containing 79.5% of a nonvolatile component, 4.26 functions), and 124.3 g (0.035 mol) of polybutadiene diol (molecular weight: 3550) were put into a flask provided with a stirrer, a thermometer, and a condenser. Then, the temperature was raised to 80° C. to melt. After that, 17.5 g (0.07 mol) of MDI was separately added for 1 hour, and the reaction was conducted at 80° C. for 7 hours. After the reaction, a transparent and thick yellow liquid was obtained. Thereby, a solution of the polyurethane resin (A-8) having the nonvolatile component of 54%, and the viscosity of 4 Pa·s at 25° C. was obtained.

The obtained solution of the polyurethane resin (A-8) was coated on a KBr board. After evaporating the solvent, the infrared absorption spectrum of the sample was measured. As a result, a peak at 2270 $cm^{-1}$ which is the characteristic absorption of an isocyanate group was disappeared completely. Thereby, it was confirmed that the isocyanate group formed a urethane bond together with the phenolic hydroxyl group of the nonyl phenol novolac resin, and a polyurethane resin which had the phenolic hydroxyl group of the nonyl phenol novolac resin in its skeleton, and in which a part of the phenolic hydroxyl group is modified with the urethane bond was obtained.

Synthetic Example 9

Production of the Polyimide Resin (C)

140 g of DMAC (dimethylacetamide), 98.4 g (0.24 mol) of TMEG (thylene glycol bisanhydrotrimellitate), 40 g (0.16 mol) of BPS, 40 g (0.16 mol) of MDI, and 26.9 g (0.16 mol) of HDI (hexamethylene diisocyanate) were put into a flask provided with a stirrer, a thermometer, and a condenser. Then, the temperature was raised to 80° C. with stirring while paying attention to heat generation, they were dissolved and reacted 80° C. for 1 hour. Then, the temperature of the obtained solution was further raised to 120° C. for 2 hours, and the reaction was conducted at this temperature for 1 hour. The reaction was allowed to progress while generating carbon dioxide gas, and a brown liquid was obtained. The solid concentration of the solution was adjusted to 55% using DMAC, and thereby a solution of the polyimide resin (C-1) having the viscosity of 100 Pa·s at 25° C. was obtained.

The obtained solution of the polyimide resin (C-1) was coated on a KBr board. After evaporating the solvent, the infrared absorption spectrum of the sample was measured. As a result, a peak at 2270 $cm^{-1}$ which is the characteristic absorption of an isocyanate group was disappeared completely, and the characteristic absorption of the imide ring was observed at 725 $cm^{-1}$, 1780 $cm^{-1}$, and 1720 $cm^{-1}$. The amount of carbon dioxide gas generated was examined depending on variation of weight of the entire flask in which the reaction was conducted, and the result was 21.1 g (0.48 mol). Thereby, it was confirmed that all of the acid anhydride group of TMEG, that is, 0.48 mol, was changed to an imide bond, and the remaining isocyanate group formed a urethane bond together with BPS, and bonded to the obtained resin.

Synthetic Example 10

Production of the Polyimide Resin (C)

156.8 g of DMAC, 65.6 g (0.16 mol) of TMEG, 29.8 g (0.16 mol) of BP, 40 g (0.16 mol) of MDI, and 21.4 g (0.12 mol as an isocyanate group) of an polyisocyanate having an isocyanurate ring derived from 1,6-hexane diisocyanate (abbreviated as "HDI-N" below, content of an isocyanate group: 23.5%, content of triisocyanate containing an isocyanurate ring: 63.3%) were put into a flask provided with a stirrer, a thermometer, and a condenser. Then, the temperature was raised to 100° C. with stirring while paying attention to heat generation, and the reaction was conducted at this temperature for 7 hours. The reaction was allowed to progress while generating carbon dioxide gas, and a transparent and brown liquid was obtained. Thereby, a solution of the polyimide resin (C-2) having the viscosity of 15 Pa·s at 25° C. was obtained.

The obtained solution of the polyimide resin (C-2) was coated on a KBr board. After evaporating the solvent, the infrared absorption spectrum of the sample was measured. As a result, a peak at 2270 cm$^{-1}$ which is the characteristic absorption of an isocyanate group was disappeared completely, and the characteristic absorption of the imide ring was observed at 725 cm$^{-1}$, 1780 cm$^{-1}$, and 1720 cm$^{-1}$. In addition, the characteristic absorption of the isocyanurate ring was observed at 1690 cm$^{-1}$ and 1460 cm$^{-1}$.

The amount of carbon dioxide gas generated was examined depending on variation of weight of the entire flask in which the reaction was conducted, and the result was 12.3 g (0.28 mol). Thereby, it was confirmed that 0.28 mol (87.5%) of the acid anhydride group relative to the total amount of 0.32 mol of the acid anhydride group of TMEG was changed to an imide bond; 0.28 mol (63.6%) of the isocyanate group relative to the total amount of 0.44 mol of the isocyanate group of MDI and HDI-N was changed to an imide bond; and the remaining isocyanate group formed a urethane bond together with BP, and bonded to the obtained resin.

Synthetic Example 11

Production of the Polyimide Resin (C)

184 g of γ-butyrolactone, 82.0 g (0.2 mol) of TMEG, 40.4 g (0.2 mol) of BPF, 34.8 g (0.2 mol) of TDI, and 26.8 g (0.15 mol as an isocyanate group) of HDI-N were put into a flask provided with a stirrer, a thermometer, and a condenser. Then, the temperature was raised to 120° C. with stirring while paying attention to heat generation, and the reaction was conducted at this temperature for 7 hours. The reaction was allowed to progress while generating carbon dioxide gas, and a transparent and brown liquid was obtained. Thereby, a solution of the polyimide resin (C-3) having the viscosity of 7 Pa·s at 25° C. was obtained.

The obtained solution of the polyimide resin (C-3) was coated on a KBr board. After evaporating the solvent, the infrared absorption spectrum of the sample was measured. As a result, a peak at 2270 cm$^{-1}$ which is the characteristic absorption of an isocyanurate group was disappeared completely, and the characteristic absorption of the imide ring was observed at 725 cm$^{-1}$, 1780 cm$^{-1}$, and 1720 cm$^{-1}$. In addition, the characteristic absorption of the isocyanate ring was observed at 1690 cm$^{-1}$ and 1460 cm$^{-1}$.

The amount of carbon dioxide gas generated was examined depending on variation of weight of the entire flask in which the reaction was conducted, and the result was 15.4 g (0.35 mol). Thereby, it was confirmed that 0.35 mol (87.5%) of the acid anhydride group relative to the total amount of 0.4 mol of the acid anhydride of TMEG was changed to an imide bond; 0.44 mol (63.6%) of the isocyanate group relative to the total amount of 0.55 mol of the isocyanate group MDI and HDI-N was changed to an imide bond; and the remaining isocyanate group formed a urethane bond together with BPF, and bonded to the obtained resin.

Synthetic Example 12

Production of the Polyimide Resin (C)

536.1 g of γ-butyrolactone, 61.8 g (6 mol as a phenolic hydroxyl group) of a phenol novolac resin (softening point: 90° C., phenolic hydroxyl equivalent: 103 g/eq., average functional group number: 6.7), 164.0 g of TMEG, and 76.8 g (0.4 mol) of TMAN (trimellitic anhydride) were put into a flask provided with a stirrer, a thermometer, and a condenser. Then, the temperature was raised to 90° C. for 1 hour and thereby they were dissolved. After that, 87.0 g (0.5 mol) of TDI and 100.0 g (0.4 mol) of MDI were added, and the temperature was raised to 150° C., and the reaction was conducted for 7 hours. After the reaction, a transparent and thick yellow liquid was obtained. Thereby, a solution of the polyimide resin (C-4) having the nonvolatile content of 40% and the viscosity of 75 Pa·s at 25° C. was obtained.

The obtained solution of the polyimide resin (C-4) was coated on a KBr board. After evaporating the solvent, the infrared absorption spectrum of the sample was measured. As a result, a peak at 2270 cm$^{-1}$ which is the characteristic absorption of an isocyanate group was disappeared completely, and the characteristic absorption of the imide ring was observed at 725 cm$^{-1}$, 1780 cm$^{-1}$, and 1720 cm$^{-1}$. In addition, the characteristic absorption of the amide bond was observed at 1670 cm$^{-1}$. The characteristic absorption of the urethane bond was also observed at 1540 cm$^{-1}$. The amount of carbon dioxide gas generated involved with the progress of the imidization and the amidation was examined depending on the variation of weight of the entire flask in which the reaction was conducted, and the result was 70.4 g (1.6 mol). Thereby, it was confirmed that 1.6 mol (88.9%) of the isocyanate group relative to the total amount of 1.8 mol of the isocyanate group was changed to an imide bond or an amide bond, and the remaining isocyanate group formed a urethane bond together with the phenolic hydroxyl group of the phenol novolac resin. It was also confirmed that a polyurethane imide amide resin which had the phenolic hydroxyl group of the phenol novolac resin in its skeleton, and in which a part of the phenolic hydroxyl group was modified by the urethane bond was obtained.

Synthetic Example 13

Production of the Polyimide Resin (C)

203.5 g of γ-butyrolactone, 57.4 g (0.14 mol) of TMEG, 28.28 g (0.14 mol) of BPF, 48.72 g (0.28 mol) of TDI, and 69.08 g (0.14 mol as a hydroxyl group) of HGMPD-C (polycarbonate diol obtained from 1,6-hexanediol and methyl pentanediol: hydroxyl equivalent: 113.7 KOH-mg/g) were put into a flask provided with a stirrer, a thermometer, and a condenser. Then, the temperature was raised to 80° C. with stirring while paying attention to heat generation, and they were dissolved and reacted at this temperature for 1 hour. After that, the temperature was further raised to 120° C. for 2 hours, and the reaction was conducted at this temperature for 4 hours. The reaction was allowed to progress while generating carbon dioxide gas, and a dark brown liquid was obtained. Thereby, a solution of the polyimide resin (C-5) (resin content: 48.4%) having the viscosity of 15 Pa·s at 25° C. was obtained.

The obtained solution of the polyimide resin (C-5) was coated on a KBr board. After evaporating the solvent, the infrared absorption spectrum of the sample was measured. As a result, a peak at 2270 cm$^{-1}$ which is the characteristic absorption of an isocyanate group was disappeared completely, and the characteristic absorption of the imide ring was observed at 725 cm$^{-1}$, 1780 cm$^{-1}$, and 1720 cm$^{-1}$. The amount of carbon dioxide gas generated was examined depending on variation of weight of the entire flask in which the reaction was conducted, and the result was 12.32 g (0.28 mol). Thereby, it was confirmed that all of the acid anhydride group, 0.28 mol (0.14 mol of TMEG has 0.28 mol of an acid anhydride group) of the acid anhydride group was changed to an imide bond, and the remaining isocyanate group formed a urethane bond together with BPF and HGMPD-C, and bonded to the obtained resin.

Synthetic Example 14

Production of the Polyimide Resin (C)

161.42 g of DMAC, 19.2 g (0.1 mol) of TMAN, 18.6 g (0.10 mol) of BP, 35 g (0.14 mol) of MDI, 10.7 g (0.06 mol as an isocyanate group) of HDI-N, and 77.92 g (0.04 mol as a hydroxyl group) of HGPD-C (polycarbonate diol obtained from 1,6-hexanediol and pentanediol: hydroxyl equivalent: 57.6 KOH-mg/g) were put into a flask provided with a stirrer, a thermometer, and a condenser. Then, the temperature was raised to 140° C. with stirring while paying attention to heat generation, and the reaction was conducted at this temperature for 5 hours. The reaction was allowed to progress while generating carbon dioxide gas, and a transparent and brown liquid was obtained. Thereby, a solution of the polyimide resin (C-6) (resin content: 48.6%) having the viscosity of 40 Pa·s at 25° C. was obtained.

The obtained solution of the polyimide resin (C-6) was coated on a KBr board. After evaporating the solvent, the infrared absorption spectrum of the sample was measured. As a result, a peak at 2270 cm$^{-1}$ which is the characteristic absorption of an isocyanate group was disappeared completely, and the characteristic absorption of the imide ring was observed at 725 cm$^{-1}$, 1780 cm$^{-1}$, and 1720 cm$^{-1}$. In addition, the characteristic absorption of the isocyanurate ring was observed at 1690 cm$^{-1}$ and 1460 cm$^{-1}$.

The amount of carbon dioxide gas generated was examined depending on variation of weight of the entire flask in which the reaction was conducted, and the result was 8.8 g (0.2 mol). Thereby, it was confirmed that the total amount of the acid anhydride group and the carboxyl group of TMAN, and the acid anhydride group of TMEG was changed to an imide bond and an amide bond; 0.2 mol (47.1%) of the isocyanate group relative to the total amount of 0.34 mol of the isocyanate group of MDI and HDI-N was changed to an imide bond and an amide; and the remaining isocyanate group formed a urethane bond together with BP and HGPD-C, and bonded to the obtained resin.

Synthetic Example 15

Production of the Polyimide Resin (C)

102.7 g of γ-butyrolactone, 102.7 g of solvesso 150, 20.2 g (0.1 mol) of BPF, 34.8 g (0.2 mol) of TDI, 109.4 g (0.05 mol) of HPB (hydrogenated polybutadiene diol, hydroxyl equivalent: 51.3 KOH-mg/g) were put into a flask provided with a stirrer, a thermometer, and a condenser. Then, the temperature was raised to 80° C. with stirring while paying attention to heat generation, and the reaction was conducted at this temperature for 2 hours. Then, 41 g (0.1 mol) of TMEG was added, the temperature was raised to 140° C. for 1 hour, and they were reacted. The reaction was allowed to progress while generating carbon dioxide gas, and a slightly clouded dark brown liquid was obtained. Thereby, a solution of the polyimide resin (C-7) (resin content: 48.9%) having the viscosity of 27 Pa·s at 25° C. was obtained.

The obtained solution of the polyimide resin (C-7) was coated on a KBr board. After evaporating the solvent, the infrared absorption spectrum of the sample was measured. As a result, a peak at 2270 cm$^{-1}$ which is the characteristic absorption of an isocyanate group was disappeared completely, and the characteristic absorption of the imide ring was observed at 725 cm$^{-1}$, 1780 cm$^{-1}$, and 1720 cm$^{-1}$.

The amount of carbon dioxide gas generated was examined depending on variation of weight of the entire flask in which the reaction was conducted, and the result was 8.8 g (0.2 mol). Thereby, it was confirmed that the total amount of the acid anhydride group of TMEG was changed to an imide bond; 0.2 mol (50%) of the isocyanate group relative to the total amount of 0.4 mol of the isocyanate group of TDI was changed to an imide bond; and the remaining isocyanate group formed a urethane bond together with BPF and HPB, and bonded to the obtained resin.

Synthetic Example 16

Production of the Polyimide Resin (C)

517.3 g of γ-butyrolactone, 391.3 g of solvesso 150, 222 g (1 mol) of IPDI (isophorone diisocyanate), 757.1 g (0.5 mol) of HPB (hydrogenated polybutadiene diol, molecular weight: 1514) were put into a flask provided with a stirrer, a thermometer, and a condenser. Then, the temperature was raised to 50° C., and the reaction was conducted at this temperature for 2 hours. Then, 613 g (2.13 mol as a phenolic hydroxyl group) of a nonyl phenol novolac resin solution (hydroxyl equivalent: 288 g/eq., mineral spirits solution containing 79.5% of a nonvolatile component, 4.26 functions), and 102.5 g (0.25 mol) of TMEG were added, the temperature was raised to 150° C. for 2 hour, and they were reacted. After that, 87.0 g (0.5 mol) of TDI, and 100.0 g (0.4 mol) of MDI were added, and the temperature was raised to 150° C., and the reaction was conducted for 5 hours. After the reaction, a transparent and dark brown liquid was obtained. Thereby, a solution of the polyimide resin (C-8) having the nonvolatile content of 59% and the viscosity of 25 Pa·s at 25° C. was obtained.

The obtained solution of the polyimide resin (C-8) was coated on a KBr board. After evaporating the solvent, the infrared absorption spectrum of the sample was measured. As a result, a peak at 2270 cm$^{-1}$ which is the characteristic absorption of an isocyanate group was disappeared completely, and the characteristic absorption of the imide ring was observed at 725 cm$^{-1}$, 1780 cm$^{-1}$, and 1720 cm$^{-1}$. The amount of carbon dioxide gas generated involved with the progress of imidization and amidation was examined depending on variation of weight of the entire flask in which the reaction was conducted, and the result was 22 g (0.5 mol). Thereby, it was confirmed that 0.5 mol (25%) of the isocyanate group relative to the total amount of 2 mol of the isocyanate group was changed to an imide bond; and the remaining isocyanate group formed a urethane bond together with the hydroxyl group of HPB and the phenolic hydroxyl group of NPN resin. It was also confirmed that a polyurethane imide resin which had the phenolic hydroxyl group of the phenol novolac resin, and in which a part of the phenolic hydroxyl group was modified by the urethane bond was obtained.

Synthetic Example 17

Production of Comparative Polyimide Resin (C')

4951 g of diethylene glycol monoethyl ether acetate, 2760 g (12 mol as an isocyanate group) of IPDI-N (an isocyanurate compound of isophorone diisocyanate; NCO %: 18.26%), 2191 g (2 mol as a hydroxyl group) of POLYTAIL HA [liquid hydrogenated polybutadiene having a hydroxyl group at both ends, made by Mitsubishi Chemical Corporation, number average molecular weight: 2,100, hydroxyl value: 51.2 mg KOH/g] were put into a 20-liter flask provided with a stirrer, a thermometer, and a condenser. Then, the temperature was raised to 80° C. with stirring while paying attention to heat generation, and the reaction was conducted at this temperature for 3 hours. Then, 1536 g of diethylene glycol monoethyl ether acetate, and 1536 g (8 mol) of trimellitic anhydride were added, the temperature was raised to 160° C., and they were reacted for 4 hours. The reaction was allowed to progress while generating carbon dioxide gas, and a transparent and thin brown liquid was obtained. Thereby, a solution of the polyimide resin (C'-1) (resin content: 47.1%) was obtained.

Then the infrared absorption spectrum was measured in a manner identical to that of Synthetic Example 1, except that the obtained polyimide resin (C'-1) was used instead of the polyimide resin (C-1). As a result, a peak at 2270 $cm^{-1}$ which is the characteristic absorption of an isocyanate group was disappeared completely, and the characteristic absorption of the imide ring was observed at 725 $cm^{-1}$, 1780 $cm^{-1}$, and 1720 $cm^{-1}$. In addition, the characteristic absorption of the isocyanurate ring was observed at 1690 $cm^{-1}$ and 1460 $cm^{-1}$. Furthermore, the characteristic absorption of the urethane bond was observed at 1550 $cm^{-1}$. The acid value of the polyimide resin was 79 (calculated based on the resin solid component), and the concentration of an isocyanurate ring was 0.66 mmol/g (calculated based on the resin solid component).

Example 1

A thermosetting resin composition 1 of the present invention was prepared according to the proportions shown in Table 1. Then, the electrical properties, heat resistance, and dimensional stability of a cured coated film made of the obtained thermosetting resin composition 1, and the dimensional stability of the thermosetting resin composition were evaluated in accordance with the following methods. The results are shown in Table 4.

(1) Evaluation of Electrical Properties

The electrical properties were evaluated by measuring the dielectric constant (∈) and dielectric loss (Tan δ) of a coated film. The coated film, which is a sample, was obtained by coating the thermosetting resin composition 1 on a tin plate such that the film thickness after curing be 80 μm. After drying it for 20 minutes in a dryer at 70° C., it was cured at 200° C. for 1 hour, then it was cooled. Then, the coated film was peeled and cut to make the sample. The dielectric constant (∈) and dielectric loss (Tan δ) of the sample were measured using 4291B marketed by Agilent Technologies under the conditions in which the frequency was 100-MHz, and the temperature was 23° C.

(2) Evaluation of Heat Resistance and Dimensional Stability

The heat resistance was evaluated by measuring the glass transition point (Tg) of a cured coated film. The dimensional stability was evaluated by measuring the linear expansion coefficient.

<Production of a Test Sample>

A test sample was obtained by coating the thermosetting resin composition 1 on a tin plate such that the film thickness after curing was 50 μm. After drying it for 20 minutes in a dryer at 70° C., it was cured at 200° C. for 1 hour, and then it was cooled. Then, the coated film was peeled off and cut to make a sample of 5 mm in width×30 mm in length.

<Tg Measuring Method>

Tg was measured using TMA-SS 6000 (Thermal Analytical system) in TMA (Thermal Mechanical Analysis) method under conditions in which the sample length was 10 mm, the rate of temperature rise was 10° C./min, and the load was 30 mN. Moreover, Tg was defined as the turning point obtained from the temperature-dimensional change curve in TMA measurement. The higher the Tg, the better the heat resistance is. The linear expansion coefficient was calculated from variations of sample length at 50 to 60° C. and 110 to 120° C. The smaller the linear expansion coefficient, the better the dimension stability is.

Moreover, the linear expansion coefficients at 50 to 60° C. and 110 to 120° C. are respectively denoted by "linear expansion coefficient 1" and "linear expansion coefficient 2" in Tables 4 and 5. The unit of the linear expansion coefficient is PPM (cm/cm/° C.)×$10^6$.

(3) Storage Stability (Storage Stability of the Thermosetting Resin Composition 1)

The thermosetting polyurethane resin composition 1 was stored in a sealed glass bottle. After 1 week at 40° C., the conditions of the thermosetting polyurethane resin composition 1 were evaluated visually. The evaluation was conducted based on the following standards.

Good: There was no aggregate or deposition. The viscosity was not increased, and it had fluidity.

Fair: There was no aggregate and deposition. However, it was sticky or the viscosity was increased.

Poor: Gelation occurred.

Examples 2 to 9 and Comparative Examples 1 to 5

The thermosetting resin compositions 2 to 9 and the comparative thermosetting resin compositions 1' to 5' were prepared in a manner identical to Example 1, except that the thermosetting resin compositions were obtained using the proportions shown in Tables 1 to 3. Then, the obtained thermosetting resin compositions were evaluated in the same manner as in Example 1. The results are shown in Tables 4 and 5.

TABLE 1

|  | Example | | | | | | | |
|---|---|---|---|---|---|---|---|---|
|  | 1 | 2 | 3 | 4 | 5 | 6 | 7 | 8 |
| Resin composition number | 1 | 2 | 3 | 4 | 5 | 6 | 7 | 8 |
| A-1 | 70 | 50 | 50 | | | | | |
| A-2 | | | | 70 | | | | |
| A-3 | | | | | 70 | | | |
| A-4 | | | | | | 70 | | |
| A-5 | | | | | | | 70 | |
| A-6 | | | | | | | | 70 |
| N680 | 30 | 50 | | 30 | 30 | 30 | 30 | 30 |
| EP2050 | | | 50 | | | | | |
| 2E4MZ | 5 | 5 | 5 | 5 | 5 | 5 | 5 | 5 |
| DBTA | 5 | 5 | 5 | 5 | 5 | 5 | 5 | 5 |

TABLE 2

|  | Example 9 |
|---|---|
| Resin composition number | 9 |
| A-1 | |
| A-2 | |
| A-3 | |
| A-4 | |
| A-5 | |
| A-6 | |
| A-7 | 70 |
| N680 | 30 |
| EP2050 | |

TABLE 2-continued

|  | Example 9 |
|---|---|
| 2E4MZ | 5 |
| DBTA | 5 |

TABLE 3

|  | Comparative Example | | | | |
|---|---|---|---|---|---|
|  | 1 | 2 | 3 | 4 | 5 |
| Resin composition number | 1' | 2' | 3' | 4' | 5' |
| N680 | 70 | 50 | 70 |  |  |
| EP2050 |  |  |  | 70 | 50 |
| CNR | 30 | 50 |  | 30 | 50 |
| BPF |  |  | 30 |  |  |
| 2E4MZ | 5 | 5 | 5 | 5 | 5 |
| DBTA | 5 | 5 | 5 | 5 | 5 |

TABLE 4

|  | Example | | | | | | | |
|---|---|---|---|---|---|---|---|---|
|  | 1 | 2 | 3 | 4 | 5 | 6 | 7 | 8 |
| Resin composition number | 1 | 2 | 3 | 4 | 5 | 6 | 7 | 8 |
| Electrical properties ε | 2.33 | 2.39 | 2.06 | 2.54 | 2.78 | 2.56 | 2.22 | 2.31 |
| Tan δ (×100) | 5.2 | 7.5 | 7.4 | 5.56 | 9.01 | 7.89 | 5.1 | 6.39 |
| Tg | 217 | 222 | 232 | 210 | 224 | 219 | 245 | 239 |
| Linear expansion coefficient 1 | 56 | 62 | 64 | 65 | 50 | 57 | 49 | 49 |
| Linear expansion coefficient 2 | 76 | 82 | 135 | 73 | 67 | 69 | 56 | 61 |
| Storage stability | Good | Good | Good | Good | Good | Good | Good | Good |

TABLE 5

|  | Example | Comparative Example | | | | |
|---|---|---|---|---|---|---|
|  | 9 | 1 | 2 | 3 | 4 | 5 |
| Resin composition number | 9 | 1' | 2' | 3' | 4' | 5' |
| Electrical properties ε | 2.71 | 3.44 | 3.21 | 3.22 | 3.01 | — |
| Tan δ (×100) | 8.7 | 25.9 | 22.5 | 21.4 | 20.2 | — |
| Tg | 235 | 132 | 128 | 132 | 93 | — |
| Linear expansion coefficient 1 | 52 | 75 | 78 | 69 | 81 | — |
| Linear expansion coefficient 2 | 78 | 164 | 169 | 162 | 149 | — |
| Storage stability | Good | Fair | Fair | Good | Good | Good |

— denotes the evaluation was impossible.

Example 10

The thermosetting resin composition 10 of the present invention was prepared using the proportions shown in Table 6. Then, the compatibility, film formability, heat resistance, mechanical and physical properties, electrical property, and dimensional stability of a cured coated film made of the thermosetting resin composition 10, and the storage stability of the thermosetting resin composition 10 were evaluated in accordance with the following methods. The results are shown in Table 8.

(1) Evaluation of Compatibility

The soluble conditions of thermosetting resin composition 10 just after preparing it, and the condition of a coated film which was obtained by coating the thermosetting resin composition 10 on a glass plate and drying it at 120° C. were evaluated in accordance with the following standards.

Standards

Excellent: The thermosetting resin composition 10 was made uniform by stirring, and foreign matter was not observed on the surface of the obtained coated film.

Good: The thermosetting resin composition 10 was uniformly dissolved by stirring, and foreign matter was not seen on the surface of the obtained coated film.

Fair: The thermosetting resin composition 10 was not easily uniformly dissolved by stirring, and foreign matter was observed to some extent on the surface of the obtained coated film.

Poor: The thermosetting resin composition 10 was not uniformly dissolved by stirring, and shedding, foreign matter and insoluble matter were observed on the surface of the obtained coated film.

(2) Evaluation of the Coated Film Formability

The thermosetting resin composition 10 was coated onto a tin plate using an applicator such that the thickness after drying was 30 μm, and dried at 110° C. for 30 minutes to obtain a test piece. The obtained test piece was allowed to stand at room temperature for 24 hours, and then the appearance of the test piece was evaluated in accordance with the following standards.

Standards

Good: Abnormalities, such as cracks, were not seen.

Poor: Some cracks were seen.

Very poor: Cracks were seen over the entire surface of the test piece.

(3) Evaluation of Heat Resistance

Heat resistance was evaluated by measuring the glass transition point (Tg) of the cured film.

<Production of a Test Sample>

A test sample was obtained by coating the thermosetting resin composition 10 on a tin plate such that the film thickness after curing was 50 μm. After drying for 30 minutes in a dryer at 70° C., it was cured at 200° C. for 1 hour, and then it was cooled to room temperature. Then, the coated film was peeled off and cut to make the test sample.

<Tg Measuring Method>

The dynamic viscoelasticity was measured using the test sample under the following conditions. The highest temperature at Tan δ of the obtained spectrum is defined as Tg. The higher Tg is higher, the more excellent heat resistance is.

Equipment: Viscoelasticity measuring apparatus RSA-II marketed by Rheometric Scientific Jig: jig for tensile tests Difference between zippers: 20 mm Temperature: 25 to 300° C.
Frequency: 1 Hz
Rate of temperature rise: 3° C./min
(4) Evaluation of Mechanical and Physical Properties The mechanical and physical properties were evaluated by a tensile test on a coated film.

<Production of a Test Sample>

A test sample was obtained by coating the thermosetting resin composition 10 on a tin plate such that the film thickness after curing was 50 µm. After drying it for 20 minutes in a dryer at 70° C., it was cured at 200° C. for 1 hour to produce a cured coated film. After cooling it to room temperature, the cured coated film was cut, and peeled off from the plate to make the test sample.

<Tensile Test Method>

Five test samples were produced. The tensile test was performed under the following conditions, and the rupture strength and the rupture elongation were obtained. The larger the rupture strength and the rupture elongation, the better the mechanical and physical properties are.

Equipment: Tensilon, marketed by Toyo Baldwin
Sample size: 10 mm×70 mm
Difference between zippers: 20 mm
Tension rate: 10 mm/min
Atmosphere: 22° C., 45% RH (5) Evaluation of Electrical Properties The electrical properties were evaluated by measuring the dielectric constant ($\in$) and dielectric loss (Tan δ) of the coated film.

A test sample was obtained by coating the thermosetting resin composition 1 on a tin plate such that the film thickness after curing was 100 µm. After drying it for 20 minutes in a dryer at 70° C., it was cured at 200° C. for 1 hour, and then it was cooled. Then, the coated film was peeled off and cut to make the test sample. Then, the dielectric constant ($\in$) and dielectric loss (Tan δ) were measured using the test sample 4291B marketed by Agilent Technologies under conditions of 500-MHz.

(6) Dimensional Stability

Dimensional stability was evaluated by measuring the linear expansion coefficient of the cured coated film.

<Production of a Test Sample>

A test sample was obtained by coating the thermosetting resin composition 1 on a tin plate such that the film thickness after curing was 50 µm. After drying it for 20 minutes in a dryer at 70° C., it was cured at 200° C. for 1 hour, and then it was cooled. Then, the coated film was peeled off and cut to make a test sample of 5 mm in width×30 mm in length.

<Measuring Method for Linear Expansion Coefficient>

The linear expansion coefficient was measured using TMA-SS 6000 (Thermal Analytical system) using the TMA (Thermal Mechanical Analysis) method under conditions in which the sample length was 10 mm, the rate of temperature rise was 10° C./min, and the load was 49 mN. Moreover, the linear expansion coefficient was calculated from variations of sample length at 40 to 50° C. The smaller the linear expansion coefficient, the better the dimension stability is. The unit of the linear expansion coefficient is PPM (cm/cm/° C.)×10$^6$.

(7) Storage Stability (Storage Stability of the Thermosetting Resin Composition 1)

20 ml of the thermosetting polyurethane resin composition 1 was stored in a 25 ml-glass bottle. After 1 week, the conditions of the thermosetting polyurethane resin composition 1 were evaluated visually.

Examples 11 to 14 and Comparative Examples 6 to 8

The thermosetting resin compositions 11 to 14 and the comparative thermosetting resin compositions 6' to 8' were prepared in a manner identical to Example 10, except that the thermosetting resin compositions were obtained using the proportions shown in Tables 6 and 7. Then, the obtained thermosetting resin compositions were evaluated in the same manner as in Example 10. The results are shown in Tables 8 and 9.

TABLE 6

|  | Example | | | | |
|---|---|---|---|---|---|
|  | 10 | 11 | 12 | 13 | 14 |
| Resin composition number | 10 | 11 | 12 | 13 | 14 |
| B-1 | 80 | | | | |
| B-2 | | 90 | 80 | | |
| B-3 | | | | 80 | |
| B-4 | | | | | 90 |
| N680 | 20 | 10 | 20 | 20 | 10 |
| DBTL | 0.5 | 0.5 | 0.5 | 0.5 | 0.5 |
| 2E4MZ | 0.5 | 0.5 | 0.5 | 0.5 | 0.5 |

TABLE 7

|  | Comparative Example | | |
|---|---|---|---|
|  | 6 | 7 | 8 |
| Resin composition number | 6' | 7' | 8' |
| B'-1 | 80 | | |
| N680 | 20 | 50 | |
| HP4032 | | | 50 |
| TD2131 | | 50 | 50 |
| TPP | 1 | 1 | 1 |

TABLE 8

|  | Example | | | | |
|---|---|---|---|---|---|
|  | 10 | 11 | 12 | 13 | 14 |
| Resin composition number | 10 | 11 | 12 | 13 | 14 |
| Compatibility | Excellent | Excellent | Excellent | Excellent | Excellent |
| Film formability | Good | Good | Good | Good | Good |
| Tg (° C.) | 202 | 198 | 192 | 195 | 225 |
| Tensile test Rupture strength (MPa) | 109 | 110 | 120 | 115 | 120 |
| Rupture elongation (%) | 16 | 20 | 17 | 18 | 15 |
| Dielectric properties $\in$ | 2.65 | 2.50 | 2.55 | 2.62 | 2.66 |
| Tan δ (×1000) | 11.2 | 9.7 | 10.4 | 9.9 | 10.5 |
| Linear expansion coefficient (ppm) | 43 | 52 | 53 | 54 | 50 |
| Storage stability | No change | No change | No change | No change | No change |

TABLE 9

|  | Comparative Example | | |
|---|---|---|---|
|  | 6 | 7 | 8 |
| Resin composition number | 6' | 7' | 8' |
| Compatibility | Excellent | Excellent | Excellent |
| Film formability | Good | Good | Good |
| Tg (° C.) | 237 | 120 | 150 |
| Tensile test  Rupture strength (MPa) | 57 | 35 | 60 |
| Rupture elongation (%) | 8 | 1.5 | 3 |
| Dielectric  $\epsilon$ | 2.90 | 3.7 | 3.8 |
| properties  Tan δ (×1000) | 10 | 31 | 39 |
| Linear expansion coefficient (ppm) | 120 | 85 | 127 |
| Storage stability | Gelatification | Gelatification | Gelatification |

Examples 15 to 19

The thermosetting resin compositions 15 to 19 of the present invention were prepared using the proportions shown in Table 10. Then, the compatibility, film formability, heat resistance, mechanical and physical properties, electrical property, and dimensional stability of a cured coated film made of the thermosetting resin compositions 15 to 19, and the storage stability of the thermosetting resin composition 15 to 19 were evaluated in accordance with the following methods. The results are shown in Table 11.

(1) Evaluation of Compatibility

Compatibility was evaluated in the same manner as in Example 10.

(2) Evaluation of Film Formability

Film formability was evaluated in the same manner as in Example 10.

(3) Evaluation of Heat Resistance
<Production of a Test Sample>

A test sample was obtained by coating the thermosetting resin composition 15 on a glass epoxy plate on which a copper foil was laminated such that the film thickness after curing was 50 μm. After drying it for 30 minutes in a dryer at 70° C., it was cured at 170° C. for 1 hour, and then it was cooled to room temperature to make the test sample.

<Heat Resistance Test Method>

The obtained test sample cured coated film was immersed in a fused solder bath 260° C. for 30 seconds, and cooled to room temperature. This immersion operation in a solder bath was performed three times, and the appearance of the cured coated film was evaluated in accordance with the following standards.

Excellent: Defective appearance was not observed.

Good: Abnormalities, such as swelling and peeling, were slightly observed.

Poor: Abnormalities, such as swelling and peeling, were observed over the entire coated surface.

(4) Evaluation of Mechanical and Physical Properties

Mechanical and physical properties were evaluated in the same manner as in Example 10.

(5) Storage Stability

Storage stability was evaluated in the same manner as in Example 10.

TABLE 10

|  | Example | | | | | |
|---|---|---|---|---|---|---|
|  | 15 | 16 | 17 | 18 | 19 | 20 |
| Resin composition number | 15 | 16 | 17 | 18 | 19 | 20 |
| A-8 | 80 | | | | | |
| B-5 | | 90 | 80 | | | |
| B-6 | | | | 80 | | |
| B-7 | | | | | 80 | |
| B-8 | | | | | | 80 |
| EP2050 | 20 | 10 | 20 | 20 | 20 | 20 |
| DBTL | 0.5 | 0.5 | 0.5 | 0.5 | 0.5 | 0.5 |
| 2E4MZ | 0.5 | 0.5 | 0.5 | 0.5 | 0.5 | 0.5 |

TABLE 11

|  | Example | | | | | |
|---|---|---|---|---|---|---|
|  | 15 | 16 | 17 | 18 | 19 | 20 |
| Resin composition number | 15 | 16 | 17 | 18 | 19 | 20 |
| Compatibility | Excellent | Excellent | Excellent | Excellent | Excellent | Excellent |
| Film formability | Good | Good | Good | Good | Good | Good |
| Heat resistance | Excellent | Excellent | Excellent | Excellent | Excellent | Excellent |
| Mechanical properties  Rupture elongation (%) | 250 | 285 | 220 | 250 | 260 | 230 |
| Storage stability | No change | No change | No change | No change | No change | No change |

Footnote in Tables
N680: Cresol novolac type epoxy resin, epoxy equivalent: 214, softening temperature: 81° C.
EP2050: Solid bisphenol A type epoxy resin, epoxy equivalent: 640
DBTL: Dibutyl tin dilaurate
2E4MZ: 2-ethyl-4-methyl-imidazole DBTA: Dibutyl tin acetate HP4032: Naphthalene type epoxy resin, epoxy equivalent: 150

TD2131: Novolac type phenol resin, hydroxyl equivalent: 103, softening temperature: 80° C.

TPP: Triphenylphosphine

CNR: Orthocresol novolac type resin, melting point: 90° C., hydroxyl equivalent: 105

BPF: Bisphenol F

As shown in Tables, the cured coated film made of the thermosetting resin composition in Examples has an extremely high Tg. Therefore, it is clear that the cured coated film can have high heat resistance even at high temperatures. In addition, the cured coated film has a low dielectric constant and dielectric tangent, that is, dielectric properties are excellent while providing a high Tg.

In contrast, the cured coated film made of the thermosetting resin composition in Comparative Examples has a higher dielectric constant and dielectric tangent than those of the cured coated film obtained in Examples. In addition, the cured coated film made of the thermosetting resin composition in Comparative Examples has a lower Tg than that of the cured coated film obtained in Examples.

The invention claimed is:

1. A thermosetting resin composition containing a polyimide resin (C) which has a structure represented by at least both of the following general formulas (1) and (2), and an epoxy resin (B),

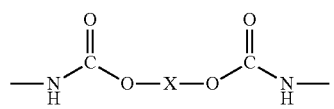

(1)

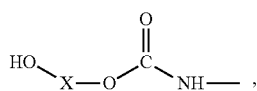

(2)

wherein X represents a residue in which two phenolic hydroxyl groups are excluded from a phenol compound having two or more phenolic hydroxyl groups in the molecule.

2. A thermosetting resin composition according to claim 1, wherein the polyimide resin (C) is a polyimide resin having a structure represented by at least one of the following general formulas (16) and (17),

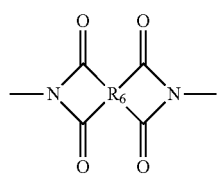

(16)

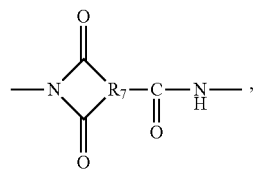

(17)

wherein $R_6$ represents a residual structure in which an acid anhydride group is excluded from a tetracarboxylic anhydride and $R_7$ represents a residual structure in which an acid anhydride group and a carboxyl group are excluded from a tricarboxylic anhydride.

3. A thermosetting resin composition according to claim 1, wherein X, in at least one of the following general formulas (1) and (2) is at least one structure represented by the general formulae (5), (7) and (9);

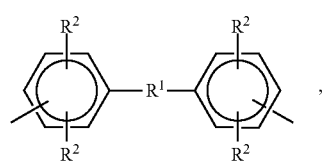

(5)

wherein $R^1$ represents a single bond or a divalent connecting group and $R^2$ may be identical or not, and represents a hydrogen atom or an alkyl group having 1 to 18 carbon atoms, and

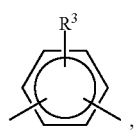

(7)

wherein $R^3$ represents a hydrogen atom, an alkyl group having 1 to 18 carbon atoms, or a structure represented by the following general formula (8)

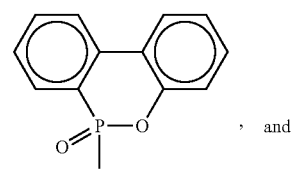

(8)

and

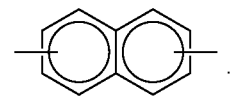

(9)

[Chemical formula 41]

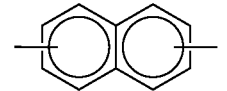

(9)

4. A thermosetting resin composition according to claim 1, wherein X, in at least one of the following the general formulas (1) and (2) is a structure represented by the general formula (6),

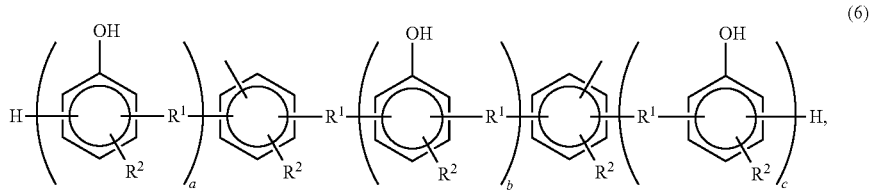

wherein $R^1$ represents a single bond or a divalent connecting group and $R^2$ may be identical or not, and represents a hydrogen atom or an alkyl group having 1 to 18 carbon atoms, wherein the total of a, b and c is one or more.

5. A thermosetting resin composition according to claim 4, wherein $R^1$ in the general formula (6) is at least one of the following: a methylene group and a structure represented by the general formula (II),

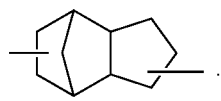

6. A thermosetting resin composition according to claim 1, wherein the polyimide resin (C) is branched in a structure represented by the general formula (15),

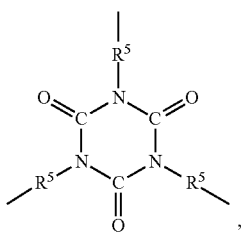

wherein $R^5$ represents a residual structure in which an isocyanate group is excluded from a diisocyanate compound.

7. A thermosetting resin composition according to claim 1, wherein the polyimide resin (C) further has a structure represented by the general formula (13),

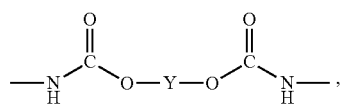

wherein Y represent a residue in which two hydroxyl groups are excluded from a polyol compound having at least two alcoholic hydroxyl groups in the molecule.

8. A thermosetting resin composition according to claim 7, wherein Y in the structure represented by the general formula (13) is a residue in which two hydroxyl groups are excluded from a polyol compound a number average molecular weight in a range from 300 to 5,000.

9. A thermosetting resin composition according to claim 7, wherein Y in the structure represented by the general formula (13) is a residue having a glass transition temperature in a range from $-150°$ C. to $0°$ C.

10. A thermosetting resin composition according to claim 7, wherein Y in the general formula (13) is at least one residue selected from the group consisting of a residue in which two alcoholic hydroxyl groups are excluded from a polyolefin polyol having at least two alcoholic hydroxyl groups in the molecule, a residue in which two hydroxyl groups are excluded from a polyether polyol having at least two alcoholic hydroxyl groups in the molecule, a residue in which two hydroxyl groups are excluded from a polycarbonate polyol having at least two alcoholic hydroxyl groups in the molecule, a residue in which two hydroxyl groups are excluded from a polyester polyol having at least two alcoholic hydroxyl groups in the molecule, and a residue in which two alcoholic hydroxyl groups are excluded from a polysiloxane polyol having at least two alcoholic hydroxyl groups in the molecule.

11. A thermosetting resin composition according to claim 1, wherein the epoxy resin (B) is an aromatic epoxy resin.

12. A thermosetting resin composition according to claim 1, wherein the thermosetting resin composition further contains a curing catalyst.

13. A thermosetting resin composition according to claim 1, wherein the thermosetting resin composition further contains an urethanization catalyst.

14. A cured material which is obtained by curing the thermosetting resin composition according to claim 1.

* * * * *